(12) United States Patent
Davenport et al.

(10) Patent No.: US 11,914,203 B2
(45) Date of Patent: Feb. 27, 2024

(54) HYBRID MULTI-WAVELENGTH SOURCE AND ASSOCIATED METHODS

(71) Applicant: Ayar Labs, Inc., Santa Clara, CA (US)

(72) Inventors: Michael Davenport, Santa Barbara, CA (US); Mark Wade, Berkeley, CA (US); Chong Zhang, San Jose, CA (US)

(73) Assignee: Ayar Labs, Inc., Santa Clara, CA (US)

( * ) Notice: Subject to any disclaimer, the term of this patent is extended or adjusted under 35 U.S.C. 154(b) by 0 days.

(21) Appl. No.: 17/892,361

(22) Filed: Aug. 22, 2022

(65) Prior Publication Data

US 2022/0390691 A1    Dec. 8, 2022

Related U.S. Application Data

(62) Division of application No. 16/925,101, filed on Jul. 9, 2020, now Pat. No. 11,422,322.

(60) Provisional application No. 62/873,429, filed on Jul. 12, 2019.

(51) Int. Cl.
    *G02B 6/42* (2006.01)

(52) U.S. Cl.
    CPC .............. *G02B 6/425* (2013.01); *G02B 6/423* (2013.01); *G02B 6/4206* (2013.01); *G02B 6/4246* (2013.01)

(58) Field of Classification Search
    CPC ........................................................ G02B 6/42
    USPC ............................................................. 385/31
    See application file for complete search history.

(56) References Cited

U.S. PATENT DOCUMENTS

| | | | | |
|---|---|---|---|---|
| 4,943,136 A * | 7/1990 | Popoff | ................. | G02B 6/2808 385/46 |
| 5,774,614 A * | 6/1998 | Gilliland | .............. | G02B 6/4274 385/94 |
| 6,459,562 B1 * | 10/2002 | KarRoy | ................. | H01L 28/40 257/295 |
| 6,690,845 B1 * | 2/2004 | Yoshimura | ............. | G02B 6/124 257/E25.032 |
| 7,778,501 B2 * | 8/2010 | Beausoleil | ............... | G02B 6/43 385/14 |
| 7,885,492 B2 * | 2/2011 | Welch | ..................... | H01S 5/026 385/14 |
| 8,184,929 B2 * | 5/2012 | Kish, Jr. | ............... | H01S 5/4025 385/32 |

(Continued)

FOREIGN PATENT DOCUMENTS

CA    3030736 A1 *   1/2018   ......... H01S 5/02325

*Primary Examiner* — Kaveh C Kianni
(74) *Attorney, Agent, or Firm* — Penilla IP, APC

(57) ABSTRACT

A substrate includes a first area in which a laser array chip is disposed. The substrate includes a second area in which a planar lightwave circuit is disposed. The second area is elevated relative to the first area. A trench is formed in the substrate between the first area and the second area. The substrate includes a third area in which an optical fiber alignment device is disposed. The third area is located next to and at a lower elevation than the second area within the substrate. The planar lightwave circuit has optical inputs facing toward and aligned with respective optical outputs of the laser array chip. The planar lightwave circuit has optical outputs facing toward the third area. The optical fiber alignment device is configured to receive optical fibers such that optical cores of the optical fibers respectively align with the optical outputs of the planar lightwave circuit.

24 Claims, 17 Drawing Sheets

(View A-A)

(56) References Cited

U.S. PATENT DOCUMENTS

| Patent/Publication No. | | Date | Inventor | Classification |
|---|---|---|---|---|
| 8,368,995 | B2* | 2/2013 | Dallesasse | H01S 5/021 359/279 |
| 9,274,275 | B2* | 3/2016 | Webster | G02B 6/305 |
| 9,625,651 | B2* | 4/2017 | Kumar | G02B 6/305 |
| 9,638,859 | B1* | 5/2017 | Nuttall | G02B 6/4274 |
| 2001/0053165 | A1* | 12/2001 | Wang | H04B 10/505 372/38.02 |
| 2002/0021873 | A1* | 2/2002 | Patzelt | G02B 6/4201 385/75 |
| 2002/0097962 | A1* | 7/2002 | Yoshimura | G02B 6/124 385/16 |
| 2003/0090774 | A1* | 5/2003 | Singh | G02F 1/01708 359/248 |
| 2003/0108081 | A1* | 6/2003 | Ryu | H01S 5/06256 372/102 |
| 2004/0057653 | A1 | 3/2004 | Fukuda et al. | |
| 2004/0086220 | A1* | 5/2004 | Mino | G02F 1/3132 385/22 |
| 2005/0058385 | A1* | 3/2005 | Tanbakuchi | G02F 1/0121 385/1 |
| 2005/0123300 | A1* | 6/2005 | Kim | H04J 14/025 398/84 |
| 2008/0031626 | A1* | 2/2008 | Welch | H01S 5/12 398/79 |
| 2008/0044128 | A1* | 2/2008 | Kish, Jr. | G02B 6/12033 385/14 |
| 2008/0240645 | A1* | 10/2008 | Funabashi | G02B 6/12004 385/14 |
| 2010/0111468 | A1* | 5/2010 | Funabashi | G02B 6/12004 385/14 |
| 2010/0119231 | A1* | 5/2010 | Kim | G02B 6/1221 372/92 |
| 2011/0110622 | A1* | 5/2011 | Akutsu | G02B 6/4225 385/14 |
| 2011/0149365 | A1* | 6/2011 | Cho | H01S 5/02438 359/578 |
| 2011/0158272 | A1* | 6/2011 | Pezeshki | H01S 5/4087 372/38.02 |
| 2012/0126224 | A1* | 5/2012 | Arai | G11C 11/403 257/43 |
| 2013/0163918 | A1* | 6/2013 | Won | G02B 6/262 438/31 |
| 2014/0184314 | A1* | 7/2014 | Takahashi | G01R 31/3833 327/524 |
| 2014/0376000 | A1* | 12/2014 | Swanson | G01B 9/02091 356/479 |
| 2015/0098676 | A1* | 4/2015 | Krasulick | G02B 6/12004 438/27 |
| 2015/0318952 | A1* | 11/2015 | Butrie | H04B 10/503 398/139 |
| 2016/0005872 | A1* | 1/2016 | Kurata | H01L 27/0688 257/43 |
| 2016/0006514 | A1* | 1/2016 | DeDobbelaere | G02B 6/12004 398/141 |
| 2016/0154185 | A1* | 6/2016 | Mori | H01R 24/66 385/56 |
| 2016/0170146 | A1 | 6/2016 | Kurokawa et al. | |
| 2016/0178861 | A1* | 6/2016 | Osenbach | G02B 6/13 385/14 |
| 2016/0306111 | A1* | 10/2016 | Lambert | G02B 6/125 |
| 2017/0163000 | A1* | 6/2017 | Evans | H01S 5/1028 |
| 2017/0163001 | A1* | 6/2017 | Evans | H04B 10/572 |
| 2017/0201070 | A1* | 7/2017 | Evans | H01S 5/4025 |
| 2017/0207603 | A1* | 7/2017 | Evans | H01S 5/0085 |
| 2018/0083417 | A1* | 3/2018 | Pezeshki | G02B 6/12004 |
| 2018/0136401 | A1* | 5/2018 | Pezeshki | G02B 6/4209 |
| 2018/0138981 | A1 | 5/2018 | Butrie et al. | |
| 2018/0351684 | A1* | 12/2018 | Osenbach | H04B 10/506 |
| 2019/0086618 | A1* | 3/2019 | Shastri | H01S 5/02469 |
| 2020/0132934 | A1* | 4/2020 | Sutherland | G02B 6/3684 |
| 2020/0183085 | A1* | 6/2020 | Mentovich | G02B 6/1223 |
| 2021/0247574 | A1* | 8/2021 | Haase | G02B 6/424 |
| 2021/0286140 | A1* | 9/2021 | Winzer | G02B 6/4206 |

\* cited by examiner (View A-A)

(View A-A)

(View A-A)

(View A-A)

(View A-A)

(View A-A)

(View A-A)

(View A-A)

(View A-A)

(View A-A)

(View A-A)

HYBRID MULTI-WAVELENGTH SOURCE AND ASSOCIATED METHODS

CLAIM OF PRIORITY

This application is a divisional application under 35 U.S.C. 121 of prior-filed U.S. patent application Ser. No. 16/925,101, filed on Jul. 9, 2020, which claims priority under 35 U.S.C. 119(e) to U.S. Provisional Patent Application No. 62/873,429, filed on Jul. 12, 2019. The disclosure of each above-identified patent application is incorporated herein by reference in its entirety for all purposes.

BACKGROUND

Optical data communication systems operate by modulating laser light to encode digital data patterns. The modulated laser light is transmitted through an optical data network from a sending node to a receiving node. The modulated laser light having arrived at the receiving node is de-modulated to obtain the original digital data patterns. Therefore, implementation and operation of optical data communication systems is dependent upon having reliable and efficient laser light sources. Also, it is desirable for the laser light sources of optical data communication systems to have a minimal form factor and be designed as efficiently as possible with regard to expense and energy consumption. It is within this context that the present invention arises.

SUMMARY

In an example embodiments, a multi-wavelength source is disclosed. The multi-wavelength source includes a substrate that includes a first area for receiving a chip and a second area elevated relative to the first area. The second area is separated from the first area by a trench having a bottom at a lower elevation within the substrate than the first area. The substrate also includes a third area next to the second area. The third area has a lower elevation within the substrate than the second area. The multi-wavelength source also includes a laser array chip disposed in the first area. The laser array chip has optical outputs facing toward the second area. The multi-wavelength sourced also includes a planar lightwave circuit disposed in the second area. The planar lightwave circuit has optical inputs facing toward and aligned with respective optical outputs of the laser array chip. The planar lightwave circuit has optical outputs facing toward the third area. The multi-wavelength sourced also includes an optical fiber alignment device disposed in the third area. The optical fiber alignment device is configured to receive a number of optical fibers such that optical cores of the number of optical fibers respectively align with the optical outputs of the planar lightwave circuit.

In an example embodiments, a method is disclosed for manufacturing a multi-wavelength source. The method includes forming a substrate to include a first area for receiving a chip. The method also includes forming the substrate to include a second area elevated relative to the first area. The method also includes forming the substrate to include a trench between the first area and the second area. The trench having a bottom at a lower elevation within the substrate than the first area. The method also includes forming the substrate to include a third area next to the second area. The third area has a lower elevation within the substrate than the second area. The method also includes disposing a laser array chip in the first area, such that optical outputs of the laser array chip face toward the second area. The method also includes disposing a planar lightwave circuit in the second area, such that optical inputs of the planar lightwave circuit face toward and align with respective optical outputs of the laser array chip, and such that optical outputs of the planar lightwave circuit face toward the third area. The method also includes disposing an optical fiber alignment device in the third area. The optical fiber alignment device is configured to receive a number of optical fibers such that optical cores of the number of optical fibers respectively align with the optical outputs of the planar lightwave circuit.

BRIEF DESCRIPTION OF THE DRAWINGS

FIG. 2A-2 shows a vertical cross-section view of the substrate, referenced as View A-A in FIG. 2A-1, in accordance with some embodiments.

FIG. 2B-1 shows a top view of the BGA disposed on the substrate, in accordance with some embodiments.

FIG. 2B-2 shows a vertical cross-section view of the BGA disposed on the substrate, referenced as View A-A in FIG. 2B-1, in accordance with some embodiments.

FIG. 2C-1 shows a top view of the laser array chip disposed on the BGA, in accordance with some embodiments.

FIG. 2C-2 shows a vertical cross-section view of the laser array chip disposed on the BGA, referenced as View A-A in FIG. 2C-1, in accordance with some embodiments.

FIG. 2E-1 shows a top view of the PLC disposed on the substrate, in accordance with some embodiments.

FIG. 2E-2 shows a vertical cross-section view of the PLC disposed on the substrate, referenced as View A-A in FIG. 2E-1, in accordance with some embodiments.

FIG. 2G-1 shows a top view of the optical fiber alignment device disposed on the substrate, in accordance with some embodiments.

FIG. 2G-2 shows a vertical cross-section view of the optical fiber alignment device disposed on the substrate, referenced as View A-A in FIG. 2G-1, in accordance with some embodiments.

FIG. 2I-1 shows a top view of the stiffener structure disposed on the substrate, in accordance with some embodiments.

FIG. 2I-2 shows a vertical cross-section view of the stiffener structure disposed on the substrate, referenced as View A-A in FIG. 2I-1, in accordance with some embodiments.

FIG. 2J-1 shows a top view of the TIM disposed on the stiffener structure, the laser array chip, and the PLC, in accordance with some embodiments.

FIG. 2J-2 shows a vertical cross-section view of the TIM disposed on the stiffener structure, the laser array chip, and the PLC, referenced as View A-A in FIG. 2J-1, in accordance with some embodiments.

DETAILED DESCRIPTION

In the following description, numerous specific details are set forth in order to provide a thorough understanding of the present invention. It will be apparent, however, to one skilled in the art that the present invention may be practiced without some or all of these specific details. In other instances, well known process operations have not been described in detail in order not to unnecessarily obscure the present invention.

Various embodiments of a hybrid multi-wavelength source (MWS) and associated methods are disclosed herein. The hybrid MWS is designed and configured to supply continuous wave (CW) laser light having multiple wavelengths. In some embodiments, the hybrid MWS is a device that emits multiple wavelengths of CW laser light that are usable in a wavelength-division multiplexing (WDM) system for transmission into a single optical fiber. Hybrid integration of the MWS disclosed herein refers to combining different devices made on separate substrates into a single package.

It should be understood that the term "wavelength" as used herein refers to the wavelength of electromagnetic radiation. And, the term "light" as used herein refers to electromagnetic radiation within a portion of the electromagnetic spectrum that is usable by optical data communication systems. In some embodiments, the portion of the electromagnetic spectrum includes light having wavelengths within a range extending from about 1100 nanometers to about 1565 nanometers (covering from the O-Band to the C-Band, inclusively, of the electromagnetic spectrum). However, it should be understood that the portion of the electromagnetic spectrum as referred to herein can include light having wavelengths either less than 1100 nanometers or greater than 1565 nanometers, so long as the light is usable by an optical data communication system for encoding, transmission, and decoding of digital data through modulation/de-modulation of the light. In some embodiments, the light used in optical data communication systems has wavelengths in the near-infrared portion of the electromagnetic spectrum. Also, the term "laser beam" as used herein refers to a beam of CW light generated by a laser device. It should be understood that a laser beam may be confined to propagate in an optical waveguide, such as (but not limited to) an optical fiber or an optical waveguide within a planar lightwave circuit (PLC). In some embodiments, the laser beam is polarized. And, in some embodiments, the light of a given laser beam has a single wavelength, where the single wavelength can refer to either essentially one wavelength or can refer to a narrow band of wavelengths that can be identified and processed by an optical data communication system as if it were a single wavelength.

Figure 1A:
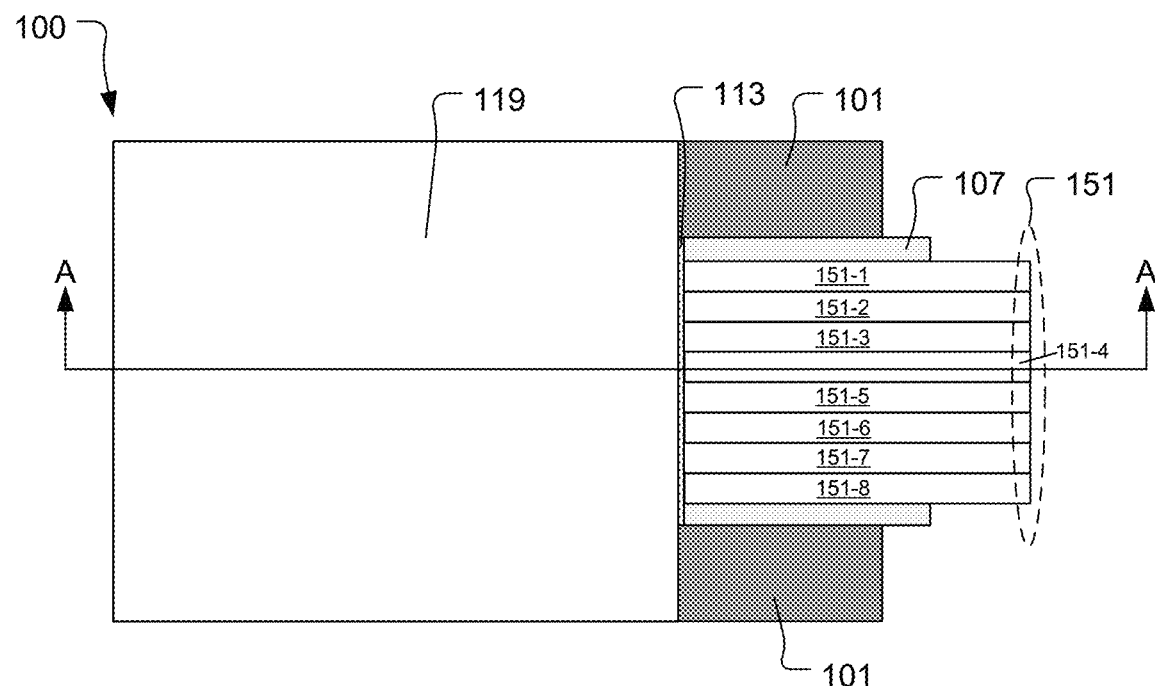
FIG. 1A shows a top view of an example hybrid MWS, in accordance with some embodiments of the present invention.
Figure 1B:
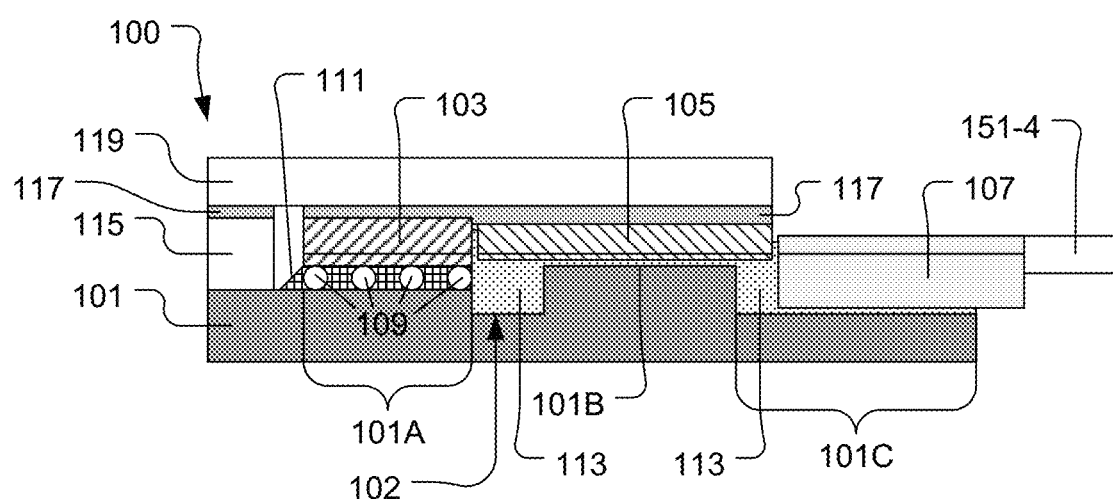
FIG. 1B shows a vertical cross-section view of the example hybrid MWS, referenced as View A-A in FIG. 1A, in accordance with some embodiments of the present invention.

FIG. 1A shows a top view of an example hybrid MWS 100, in accordance with some embodiments of the present invention. FIG. 1B shows a vertical cross-section view of the example hybrid MWS 100, referenced as View A-A in FIG. 1A, in accordance with some embodiments of the present invention. The hybrid MWS 100 includes a substrate 101, a laser array chip 103, a PLC 105, and an optical fiber alignment device 107. The substrate 101 includes a first area 101A for receiving the laser array chip 103. The substrate 101 also includes a second area 101B elevated relative to the first area 101A. The second area 101B is separated from the first area 101A by a trench 102 that has a bottom surface at a lower elevation within the substrate 101 than the first area 101A. The substrate 101 includes a third area 101C next to the second area 101B. The third area 101C has a lower elevation within the substrate 101 than the second area 101B.

The laser array chip 103 is disposed in the first area 101A. In some embodiments, the laser array chip 103 is an InP chip. However, in other embodiments, the laser array chip 103 is a chip other than InP. The laser array chip 103 has optical outputs facing toward the second area 101B. The PLC 105 is disposed in the second area 101B. The PLC 105 has optical inputs facing toward and aligned with respective optical outputs of the laser array chip 103. The PLC 105 has optical outputs facing toward the third area 101C. The optical fiber alignment device 107 is disposed in the third area 101C. The optical fiber alignment device 107 is configured to receive a number of optical fibers 151, such that optical cores of the number of optical fibers 151 respectively align with the optical outputs of the PLC 105.

In some embodiments, the laser array chip 103 is attached to the substrate 101 by flip-chip bonding, which includes disposing a ball grid array (BGA) 109 between the laser array chip 103 and respective conductive pads exposed on the substrate 101 surface. The BGA 109 provides for electrical connectivity between electrical circuitry in the laser array chip 103 and electrical circuitry within the substrate 101. In some embodiments, the substrate 101 includes a plurality of electrically conductive structures electrically connected to a plurality of electrically conductive pads exposed within the first area 101A of the substrate 101. The plurality of electrically conductive pads is configured to receive the BGA 109. In some embodiments an epoxy underfill material 111 is disposed within the first area 101A between the laser array chip 103 and the substrate 101, and between solder balls of the BGA 109. In some embodiments, the trench 102 within the substrate 101 is configured to facilitate deposition of the epoxy underfill material 111. It should be understood that flip-chip attachment of the laser array chip 103 to the substrate 101 using the BGA 109 is one of many different ways that the laser array chip 103 can be attached to the substrate 101 and electrically connected to circuitry within the substrate 101. In other embodiments, the laser array chip 103 is attached to the substrate 101 using essentially any known electronic packaging process, which can optionally include disposition of bumps, solder, underfill, and/or other component(s), between the laser array chip 103 and the substrate 101, and can include bonding techniques such as mass reflow, thermal-compression bonding (TCB), wire-bonding, or essentially any other suitable bonding technique. For example, in some embodiments, instead of using the BGA 109, the laser array chip 103 is attached to the substrate 101 using controlled collapse chip connection bumps.

The PLC 105 and the optical fiber alignment device 107 are attached to the substrate 101 by an optical index-matched epoxy material 113, such that a layer of the optical index-matched epoxy material 113 exists between the substrate 101 and each of the PLC 105 and the optical fiber alignment device 107. The optical index-matched epoxy material 113 has an optical index of refraction that is substantially the same as an optical index of refraction of optical waveguides within the PLC 105 and laser array chip 103. Also, in some embodiments, the optical index-matched epoxy material 113 has an optical index of refraction that is substantially the same as an optical index of refraction of optical cores of the optical fibers 151. In some embodiments, the optical index-matched epoxy material 113 is disposed to fill the trench 102 within the substrate 101. In some embodiments, the laser array chip 103 is slightly spaced apart from the PLC 105, such that the optical index-matched epoxy material 113 is disposed within a gap between the laser array chip 103 and the PLC 105. Also, in some embodiments, the PLC 105 is slightly spaced apart from the optical fibers 151 secured within the optical fiber alignment device 107, such that the optical index-matched epoxy material 113 is disposed within a gap between the PLC 105 and the optical cores of the optical fibers 151. And, more specifically, the optical index-matched epoxy material 113 is disposed within a gap between the PLC 105 and the optical fiber alignment device 107.

In some embodiments, a stiffener structure 115 is disposed on the substrate 101 to extend around a union of the first area 101A and the second area 101B of the substrate 101, without encroaching within the third area 101C of the substrate. In some embodiments, the stiffener structure 115 has a top surface at a substantially same elevation above the substrate 101 as a top surface of the laser array chip 103. However, in some embodiments, the top surface of the stiffener structure 115 and the top surface of the laser array chip 103 are at different elevations above the substrate 101. In various embodiments, the stiffener structure 115 is formed of a rigid material, such as aluminum or some other material that is chemically, thermally, and mechanically compatible with the interfacing materials of the hybrid MWS 100. In various embodiments, the stiffener structure 115 is attached to the substrate 101 using an adhesive material, such as an epoxy material. Also, in some embodiments, a thermal interface material (TIM) 117 is disposed across top surfaces of the stiffener structure 115, the laser array chip 103, and the PLC 105. In some embodiments, the TIM 117 is a thermal adhesive. In some embodiments, the TIM 117 is Master Bond EP30TC by Master Bond Inc. In some embodiments, the TIM 117 is a metal or metal alloy, such as Indium (In), Indium-Lead (InPb), among other materials. It should be understood that in various embodiments, the TIM 117 is essentially any adhesive thermal interface material that is used in semiconductor packaging to enhance thermal coupling between components. Also, in some embodiments, a lid structure 119 is disposed on the TIM 117. The lid structure 117 is configured to cover the laser array chip 103 and the PLC 105. The lid structure 117 is also configured to extend over the stiffener structure 115. In various embodiments, the lid structure 117 is formed of a high thermal conductivity material, such as copper, or aluminum, or copper alloy, or aluminum alloy, among others.

Figure 1C:
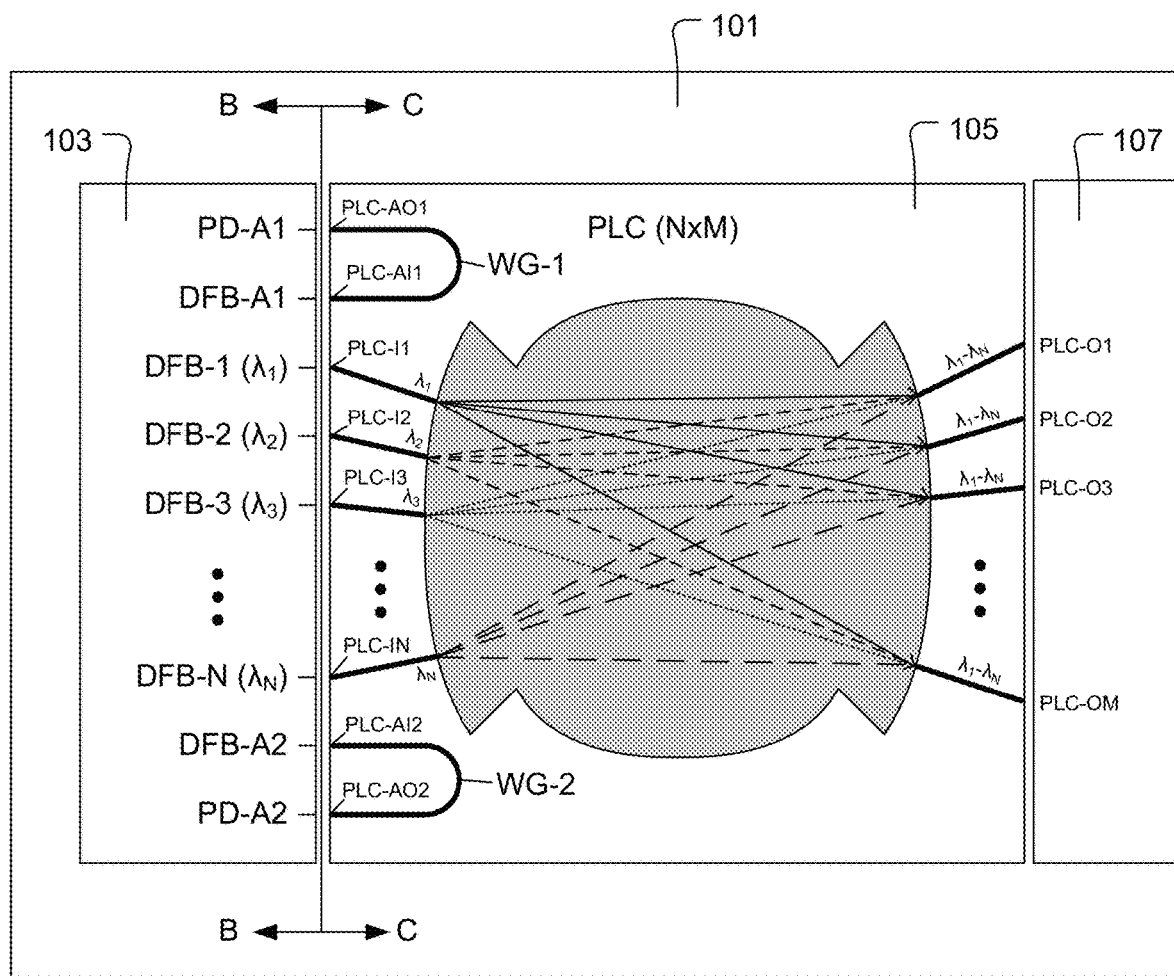
FIG. 1C shows a more detailed top view arrangement of the laser array chip and the PLC, in accordance with some embodiments.
Figure 1D:
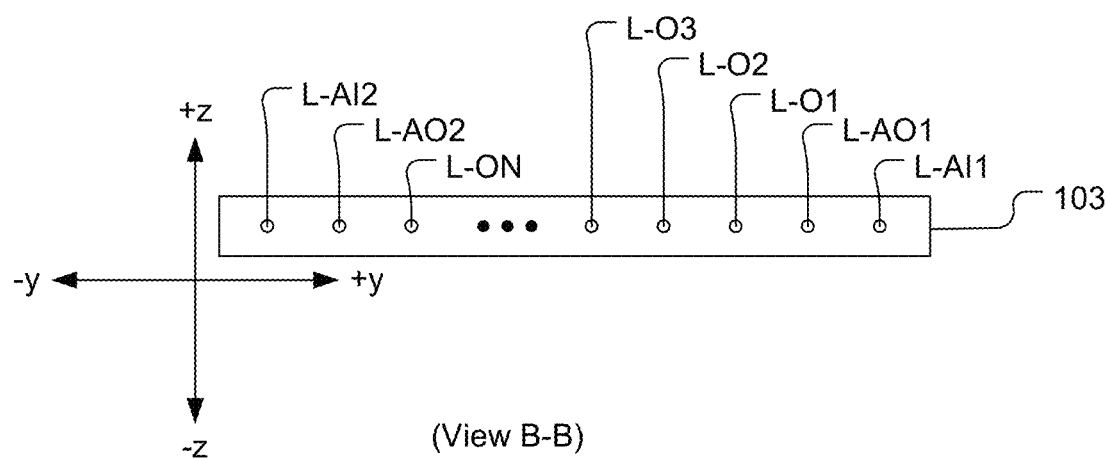
FIG. 1D shows a side view of the laser array chip as seen from the perspective of the PLC, referenced as View B-B in FIG. 1C, in accordance with some embodiments.
Figure 1E:
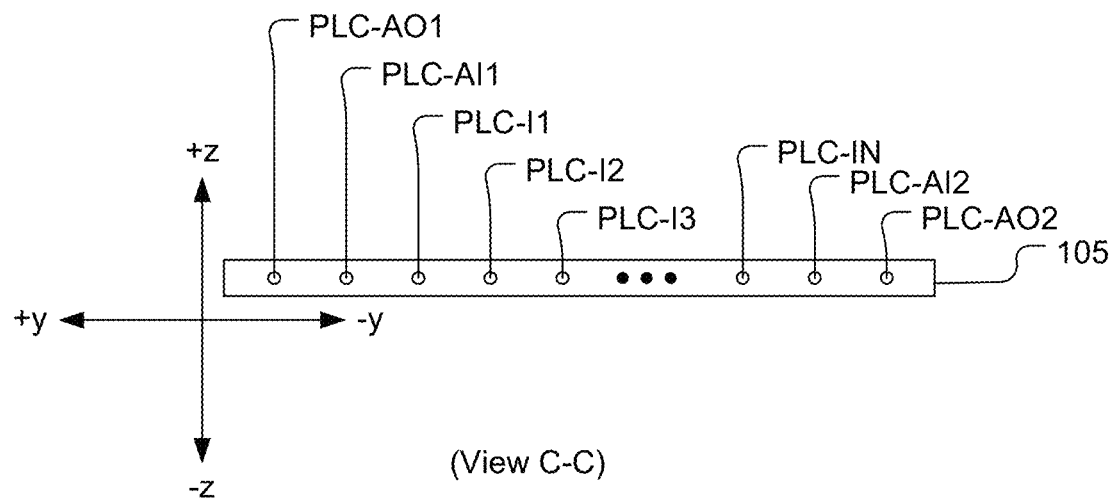
FIG. 1E shows a side view of the PLC as seen from the perspective of the laser chip array, referenced as View C-C in FIG. 1C, in accordance with some embodiments.

FIG. 1C shows a more detailed top view arrangement of the laser array chip 103 and the PLC 105, in accordance with some embodiments. FIG. 1D shows a side view of the laser array chip 103 as seen from the perspective of the PLC 105, referenced as View B-B in FIG. 1C, in accordance with some embodiments. FIG. 1E shows a side view of the PLC 105 as seen from the perspective of the laser chip array 103, referenced as View C-C in FIG. 1C, in accordance with some embodiments. The laser array chip 103 is configured to generate and output a plurality of laser beams, i.e., (N) laser beams. In some embodiments, (N) is eight. However, in other embodiments, (N) can be either less than eight or greater than eight. The plurality of laser beams have different wavelengths ($\lambda_1$-$\lambda_N$) relative to each other, where the different wavelengths ($\lambda_1$-$\lambda_N$) are distinguishable to an optical data communication system. In some embodiments, the laser array chip 103 includes a plurality of lasers DFB-1 to DFB-N for respectively generating the plurality (N) of laser beams, where each laser DFB-1 to DFB-N generates and outputs a laser beam at a respective one of the different wavelengths ($\lambda_1$-$\lambda_N$). Each of the plurality of lasers DFB-1 to DFB-N is optically connected to transmit its particular wavelength of CW laser light to a respective one of the optical outputs L-O1 to L-ON of the laser array chip 103, such that the different wavelengths ($\lambda_1$-$\lambda_N$) of CW laser light generated by the plurality of lasers DFB-1 to DFB-N are respectively provided to the different optical output L-O1 to L-ON of the laser array chip 103 for transmission from the laser array chip 103. In some embodiments, each of the plurality of lasers DFB-1 to DFB-N is a distributed feedback laser configured to generate CW laser light at a particular one of the different wavelengths ($\lambda_1$-$\lambda_N$). The distributed feedback laser is a type of diode laser that has a single-wavelength emission spectrum or a "single longitudinal mode." In some embodiments, the plurality of lasers DFB-1 to DFB-N generate CW laser light having wavelengths within the O-band, or within a range extending from 1260 nanometers to 1330 nanometers. In some embodiments, the distributed feedback of the plurality of lasers DFB-1 to DFB-N is centered at 1270 nanometers for use with SiGe photodetectors. It should be understood that in other embodiments, any of the plurality of lasers DFB-1 to DFB-N can be configured to generate CW laser light at wavelength(s) of either less than 1260 nanometers or greater than 1330 nanometers.

In some embodiments, the PLC 105 includes a dielectric core and cladding in a single layer on a silicon or glass substrate. The PLC 105 includes an interior configuration of optical waveguides configured to route light received through optical input ports PLC 105 to optical output ports of the PLC 105 in a prescribed manner. In some embodiments, the PLC 105 includes nitride waveguides. However, in other embodiments, the PLC 105 can be implemented using essentially any material that is suitable to form optical waveguides. The PLC 105 is configured to receive the plurality of laser beams of CW light of the different wavelengths ($\lambda_1$-$\lambda_N$) from the laser array chip 103 at a corresponding plurality (N) of optical input ports PLC-I1 to PLC-IN of the PLC 105, such that each of the plurality (N) of optical inputs PLC-I1 to PLC-IN of the PLC 105 receives a different wavelength of CW laser light. The PLC 105 is configured to distribute a portion of the CW laser light received at each of the optical inputs PLC-I1 to PLC-IN of the PLC 105 to each of a plurality (M) of optical output ports PLC-O1 to PLC-OM of the PLC 105, such that the different wavelengths ($\lambda_1$-$\lambda_N$) of CW laser light received through the plurality (N) of optical inputs of the PLC 105 are collectively transmitted through each of the plurality (M) of optical outputs PLC-O1 to PLC-ON of the PLC 105. In some embodiments, (M) is sixteen. However, in other embodiments, (M) is either less than sixteen or greater than sixteen. In this manner, the PLC 105 operates to distribute the plurality (N) of laser beams such that all of the different wavelengths ($\lambda_1$-$\lambda_N$) of the plurality (N) of laser beams are provided to each of the plurality (M) of optical output ports PLC-O1 to PLC-OM of the PLC 105. Therefore, it should be understood that the PLC 105 operates to provide light at all of the different wavelengths ($\lambda_1$-$\lambda_N$) of the plurality (N) of laser beams to each one of the optical output ports PLC-O1 to PLC-OM of the PLC 105. In this manner, the PLC 105 functions as an N×M optical multiplexing device. Also, the optical power transmitted at a given wavelength through any one of the plurality (M) of optical output ports PLC-O1 to PLC-OM of the PLC 105 is approximately equal to the optical power received at the given wavelength through the corresponding one of the optical inputs PLC-I1 to PLC-IN of the PLC 105 divided by (M). Therefore, it should be understood that the optical output power of the configuration of the laser array chip 103 and PLC 105 scales with the number (M) of output channels, rather than with the number (N) of generated CW laser wavelengths. In some embodiments, the PLC 105 is configured as a star coupler.

The optical fiber alignment device 107 is configured to receive the plurality (M) of optical fibers 151 and respectively align the optical cores of the plurality (M) of optical fibers 151 to the plurality (M) of optical output ports PLC-O1 to PLC-OM of the PLC 105. In some embodiments, the optical fiber alignment device 107 is a v-groove array that includes a plurality (M) of v-grooves, where each v-groove is configured to receive and align one of the plurality (M) of optical fibers 151. However, it should be understood that in other embodiments, the optical fiber alignment device 107 can be configured in a manner that does not include v-grooves, so long as the optical fiber alignment device 107 is configured to receive the plurality (M) of optical fibers 151 and respectively align the optical cores of the plurality (M) of optical fibers 151 to the plurality (M) of optical output ports PLC-O1 to PLC-OM of the PLC 105. In various embodiments, the optical fiber alignment device 107 is formed of a material that is chemically, thermally, and mechanically compatible with the interfacing materials and components of the hybrid MWS 100. For example, in some embodiments, the optical fiber alignment device 107 is formed of aluminum, plastic, or another suitable material.

In some embodiments, the laser array chip 103 is secured to the substrate 101 before the PLC 105 is secured to the substrate 101. In these embodiments, the PLC 105 has to be optically aligned with the laser array chip 103 so that the plurality of optical input ports PLC-I1 to PLC-IN of the PLC 105 respectively optically align with the plurality of optical output ports L-O1 to L-ON of the laser array chip 103. In some embodiments, the laser array chip 103 and the PLC 105 are collectively configured to provide for active alignment of the PLC 105 to the laser array chip 103 through operation of the laser array chip 103 after the laser array chip 103 is disposed in the first area 101A of the substrate 101. In some embodiments, the laser array chip 103 includes a first alignment laser DFB-A1 configured and connected to provide CW laser light to a first alignment optical output L-AO1 on the laser array chip 103. The first alignment optical output L-AO1 faces toward the second area 101B of the substrate 101 when the laser array chip 103 is attached to the substrate 101 within the first area 101A of the substrate 101. In some embodiments, the first alignment optical output L-AO1 is positioned at a first side of the plurality (N) of lasers DFB-1 to DFB-N, such as shown in FIG. 1C. The laser array chip 103 also includes a first alignment photodetector PD-A1 optically connected to a first alignment optical input L-AI1 on the laser array chip 103. The first alignment optical input L-AI1 faces toward the second area 101B of the substrate 101 when the laser array chip 103 is attached to the substrate 101 within the first area 101A of the substrate 101. In some embodiments, the first alignment optical input L-AI1 is positioned next to the first alignment optical output L-AO1, such as shown in FIG. 1D.

The PLC 105 includes a first alignment waveguide WG-1 configured to extend from a first alignment optical input PLC-AI1 on the PLC 105 to a first alignment optical output PLC-AO1 on the PLC 105, such that light entering the first alignment optical input PLC-AI1 on the PLC 105 is conveyed through the first alignment waveguide WG-1 and through the first alignment optical output PLC-AO1 on the PLC 105. The PLC 105 is configured so that both the first alignment optical input PLC-AI1 and the first alignment optical output PLC-AO1 of the PLC 105 face toward the first area 101A when the PLC 105 is positioned within the second area 101B on the substrate 101. The PLC 105 is properly aligned with the laser array chip 103 when the first alignment optical input PLC-AI1 of the PLC 105 is optically aligned with the first alignment optical output L-AO1 of the laser array chip 103, and when the first alignment optical output PLC-AO1 of the PLC 105 is optically aligned with the first alignment optical input L-AI1 of the laser array chip 103, such that CW laser light transmitted from the first alignment laser DFB-A1 travels through the first alignment waveguide WG-1 and back into the laser array chip 103 for detection by the first alignment photodetector PD-A1. In this manner, during active alignment of the PLC 105 to the laser array chip 103, the laser array chip 103 is operated so that the first alignment laser DFB-A1 operates to transmit CW laser light through the first alignment optical output L-AO1, while the first alignment photodetector PD-A1 operates to detect light received through the first alignment optical input L-AI1. Detection of light by the first alignment photodetector PD-A1 indicates that the PLC 105 is properly aligned with the laser chip array 103.

In some embodiments, to provide for even better optical alignment between the PLC 105 and the laser array chip 103, the laser array chip 103 includes a second alignment laser DFB-A2 configured and connected to provide CW laser light to a second alignment optical output L-AO2 on the laser array chip 103. The second alignment optical output L-AO2 faces toward the second area 101B of the substrate 101 when the laser array chip 103 is attached to the substrate 101 within the first area 101A of the substrate 101. In some embodiments, the second alignment optical output L-AO2 is positioned at a second side of the plurality (N) of lasers DFB-1 to DFB-N, such as shown in FIG. 1C. The laser array chip 103 also includes a second alignment photodetector PD-A2 optically connected to a second alignment optical input L-AI2 on the laser array chip 103. The second alignment optical input L-AI2 faces toward the second area 101B of the substrate 101 when the laser array chip 103 is attached to the substrate 101 within the first area 101A of the substrate 101. In some embodiments, the second alignment optical input L-AI2 is positioned next to the second alignment optical output L-AO2, such as shown in FIG. 1D.

The PLC 105 includes a second alignment waveguide WG-2 configured to extend from a second alignment optical input PLC-AI2 on the PLC 105 to a second alignment optical output PLC-AO2 on the PLC 105, such that light entering the second alignment optical input PLC-AI2 on the PLC 105 is conveyed through the second alignment waveguide WG-2 and through the second alignment optical output PLC-AO2 on the PLC 105. The PLC 105 is configured so that both the second alignment optical input PLC-AI2 and the second alignment optical output PLC-AO2 of the PLC 105 face toward the first area 101A when the PLC 105 is positioned within the second area 101B on the substrate 101. The PLC 105 is properly aligned with the laser array chip 103 when the second alignment optical input PLC-AI2 of the PLC 105 is optically aligned with the second alignment optical output L-AO2 of the laser array chip 103, and when the second alignment optical output PLC-AO2 of the PLC 105 is optically aligned with the second alignment optical input L-AI2 of the laser array chip 103, such that CW laser light transmitted from the second alignment laser DFB-A2 travels through the second alignment waveguide WG-2 and back into the laser array chip 103 for detection by the second alignment photodetector PD-A2. In this manner, during active alignment of the PLC 105 to the laser array chip 103, the laser array chip 103 is operated so that the first alignment laser DFB-A1 operates to transmit CW laser light through the first alignment optical output L-AO1, while the first alignment photodetector PD-A1 operates to detect light received through the first alignment optical input L-AI1. Also, the laser array chip 103 is operated so that the second alignment laser DFB-A2 operates to transmit CW laser light through the second alignment optical output L-AO2, while the second alignment photodetector PD-A2 operates to detect light received through the second alignment optical input L-AI2. Detection of light by both the first alignment photodetector PD-A1 and the second alignment photodetector PD-A2 indicates that the PLC 105 is properly aligned with the laser chip array 103. Detection of strong photocurrent signals by both the first alignment photodetector PD-A1 and the second alignment photodetector PD-A2 indicates that the PLC 105 is properly aligned with the laser chip array 103 with respect to coordinates in the x, y, and z directions, and with respect to roll in the y-z plane, yaw in the x-y plane, and pitch in the x-z plane.

Figure 1F:
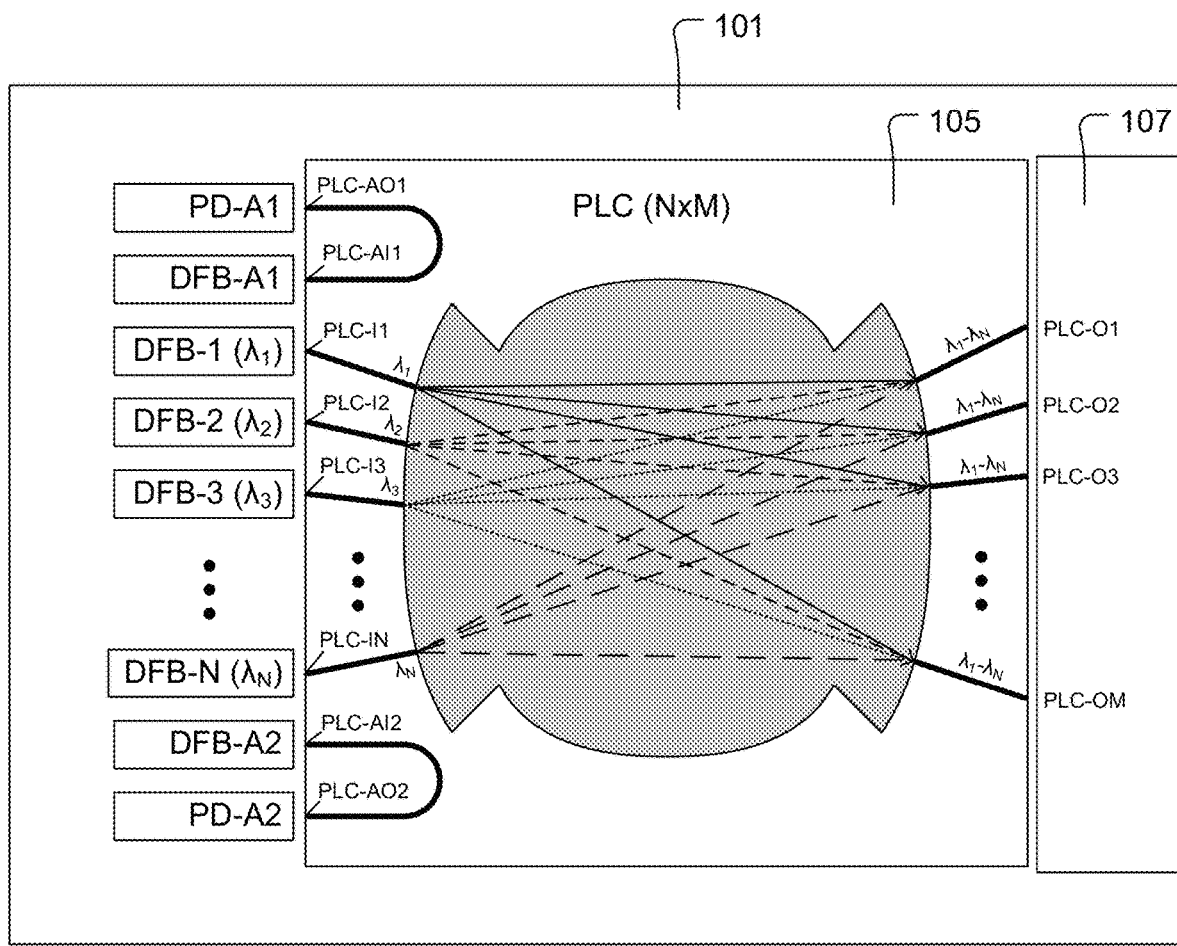
FIG. 1F shows an alternate embodiment of the hybrid MWS in which discrete lasers are disposed on the substrate, rather than having the lasers integrally formed within the laser array chip, in accordance with some embodiments.

FIG. 1F shows an alternate embodiment of the hybrid MWS 100 in which discrete lasers DFB-1 to DFB-N are disposed on the substrate 101, rather than having the lasers DFB-1 to DFB-N integrally formed within the laser array chip 103, in accordance with some embodiments. The configuration of FIG. 1F is the same as that of FIG. 1C, with the exception of having discrete lasers DFB-1 to DFB-N instead of the laser array chip 103. Also, in the embodiment of FIG. 1F, if the integrated active alignment between the PLC 105 and the lasers DFB-1 to DFB-N is implemented, then the alignment lasers DFB-A1 and DFB-A2 will also be discretely disposed on the substrate 101, and the alignment photodetectors PD-A1 and PD-A2 will also be discretely disposed on the substrate 101. In this embodiment, the position and orientation on the substrate 101 of each discrete laser DFB-1 to DFB-N is carefully controlled. Also, the position and orientation on the substrate 101 of each discrete alignment laser DFB-A1 and DFB-A2 and each discrete photodetector PD-A1 and PD-A2 is carefully controlled. In some embodiments, the substrate 101 is formed to include a number of positioning and aligning structures to facilitate proper positioning and alignment on the substrate 101 of the lasers DFB-1 to DFB-N, the alignment lasers DFB-A1 and DFB-A2, and the alignment photodetectors PD-A1 and PD-A2.

Figures 1, 2A:
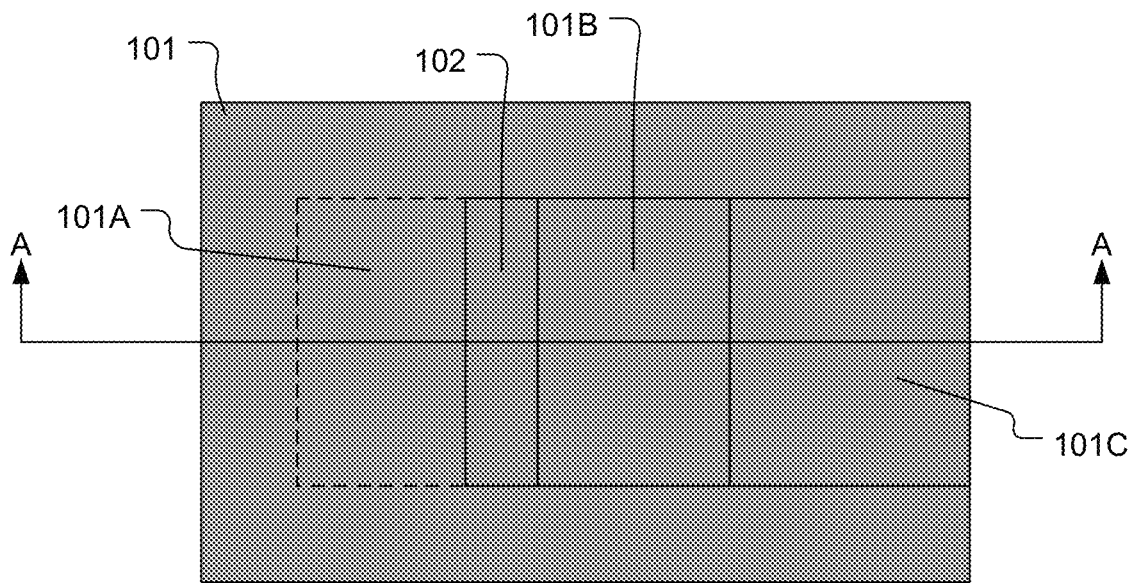
FIG. 2A-1 shows a top view of the substrate, in accordance with some embodiments.
Figures 2, 2A:
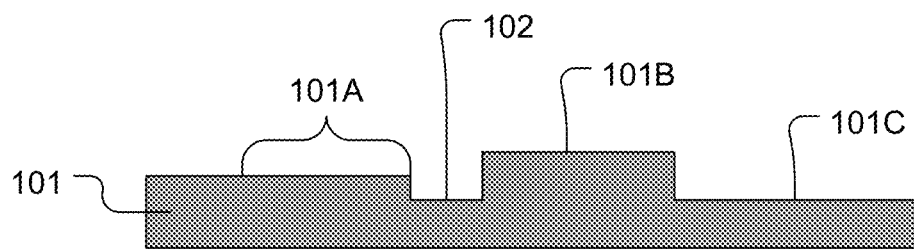

FIGS. 2A-1 through 2J-2 describe an example assembly process flow for manufacturing the hybrid MWS 100, in accordance with some embodiments. FIG. 2A-1 shows a top view of the substrate 101, in accordance with some embodiments. FIG. 2A-2 shows a vertical cross-section view of the substrate 101, referenced as View A-A in FIG. 2A-1, in accordance with some embodiments. The first area 101A is where the laser array chip 103 is to be disposed. The second area 101B is where the PLC 105 is to be disposed. The third area 101C is where the optical fiber alignment device 107 is to be disposed. The trench 102 is formed between the first area 101A and the second area 101B. In some embodiments, the trench extends along a full length of the side of the laser array chip 103 that faces toward the PLC 105, i.e., that faces toward the second area 101B. The bottom of the trench 102 is at a lower elevation with the substrate 101 than the first area 101A. Also, the second area 101B is at a higher elevation on the substrate 101 than the first area 101A. It should be understood that the second area 101B forms a mesa-like structure upon which the PLC 105 is disposed. Also, when the PLC 105 is disposed within the second area 101B, a portion of the PLC 105 will extend over and above a portion of the trench 102, and a portion of the PLC 105 will extend over and above a portion of the third area 101C. Also, the elevation of the third area 101C within the substrate 101 is lower than the elevation of the second area 101B.

It should be understood that the specific elevation of the second area 101B is set so that the optical inputs PLC-I1 to PLC-IN can be optically aligned with the optical outputs L-O1 to L-ON of the laser array chip 103. Therefore, the specific elevation of the second area 101B within the substrate 101 relative to the first area 101A is dependent upon the specific configurations of the laser array chip 103 and the PLC 105. Similarly, the specific elevation of the third area 101C is set so that the optical cores of the optical fibers 151 can be optically aligned with the optical outputs PLC-O1 to PLC-OM of the PLC 105 when the optical fibers 105 are positioned in the optical fiber alignment device 107. Therefore, the specific elevation of the third area 101C within the substrate 101 relative to the second area 101B is dependent upon the specific configurations of the PLC 105 and the optical fiber alignment device 107.

The substrate 101 is an electronic packaging substrate. In some embodiments, the substrate 101 is formed of a dielectric material. In some embodiments, the substrate 101 is formed of an organic material. In some embodiments, the substrate 101 is formed of a ceramic material. In some embodiments, the substrate 101 is formed of aluminum oxide ($Al_2O_3$), or aluminum nitride (AlN), or a similar ceramic material. In some embodiments, the substrate 101 is an Indium-Phosphide (III-V) substrate. It should be understood that in various embodiments, the substrate 101 can be formed of essentially any other type of substrate material upon which electronic devices and/or optical-electronic devices and/or optical waveguides and/or optical fiber(s)/fiber ribbon(s) can be mounted. Also, it should be understood that the substrate 101 can be configured to include electrical circuitry in the form of conductive lines/structures formed and routed in one or more levels within the substrate 101, with conductive lines/structures in different levels of the substrate 101 electrically connected by one or more conductive via structures as needed to form a prescribed electrical circuit configuration.

Figures 1, 2B:
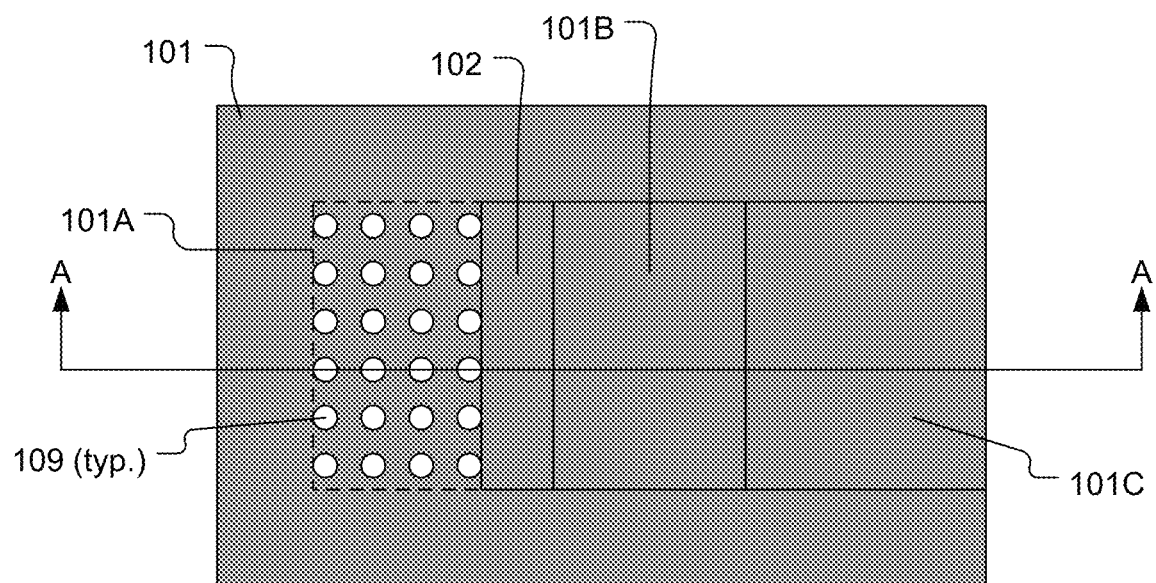
Figures 2, 2B:
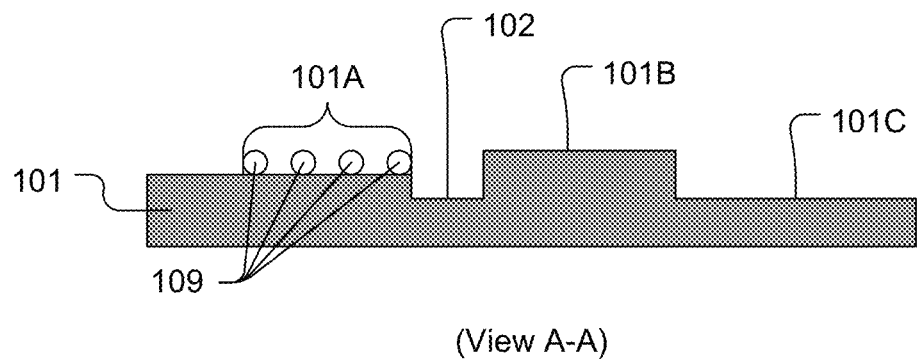

FIG. 2B-1 shows a top view of the BGA 109 disposed on the substrate 101, in accordance with some embodiments. FIG. 2B-2 shows a vertical cross-section view of the BGA 109 disposed on the substrate 101, referenced as View A-A in FIG. 2B-1, in accordance with some embodiments. It should be understood that the particular arrangement of the BGA 109 shown in FIGS. 2B-1 and 2B-2 is provided by way of example and in no way limits the possible configuration of the BGA 109 in various embodiments. Also, as previously mentioned, the BGA 109 is one example of various possible ways in which the laser array chip 103 can be physically and electrically connected to the substrate 101. Therefore, it should be understood that while the BGA 109 technique is used in some embodiments, use of the BGA 109 technique is not required in all embodiments.

Figures 1, 2C:
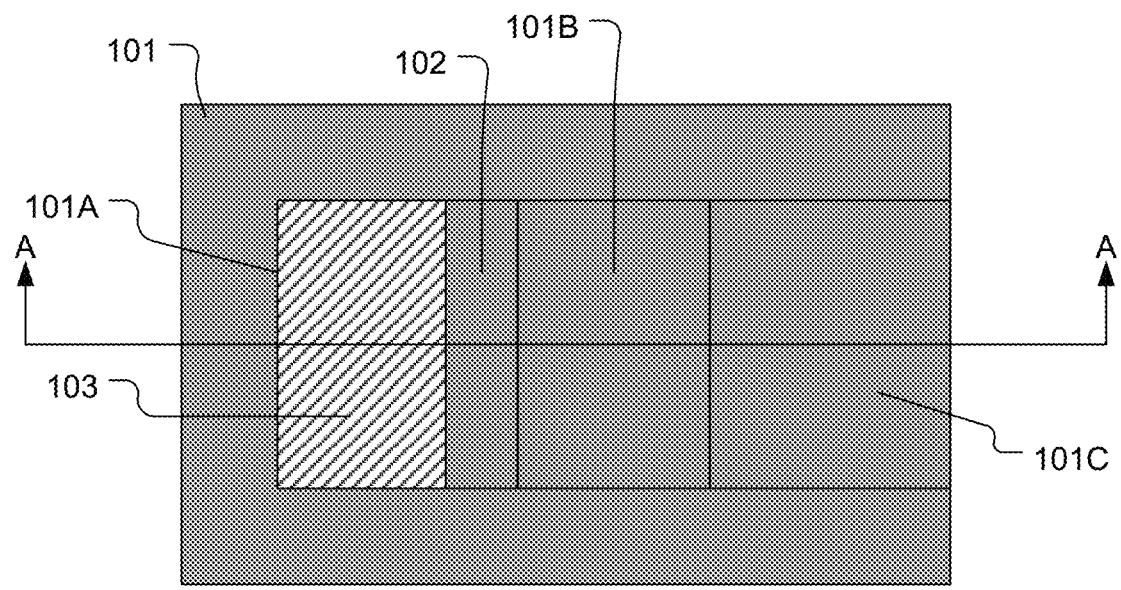
Figures 2, 2C:
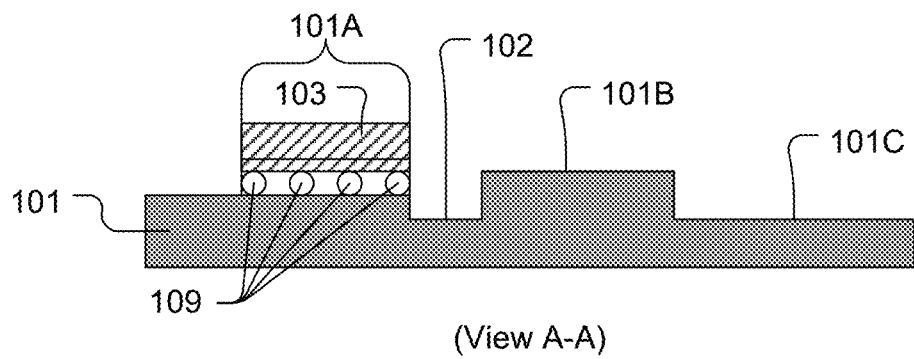

FIG. 2C-1 shows a top view of the laser array chip 103 disposed on the BGA 109, in accordance with some embodiments. FIG. 2C-2 shows a vertical cross-section view of the laser array chip 103 disposed on the BGA 109, referenced as View A-A in FIG. 2C-1, in accordance with some embodiments. In some embodiments, the laser array chip 103 is configured so that the flip-chip manufacturing technique is utilized to connected the laser array chip 103 to the BGA 109 or other connection mechanism. It should be understood that the individual solder balls of the BGA 109 are disposed on corresponding exposed electrical pads on the substrate 101. Similarly, each solder ball of the BGA 109 also contacts a corresponding exposed electrical pad on the laser array chip 103. Then, when the solder balls of the BGA 109 are reflowed, each solder ball of the BGA 109 becomes fused with its corresponding electrical pad on the substrate 101 and with its corresponding electrical pad on the laser array chip 103.

Figure 2D:
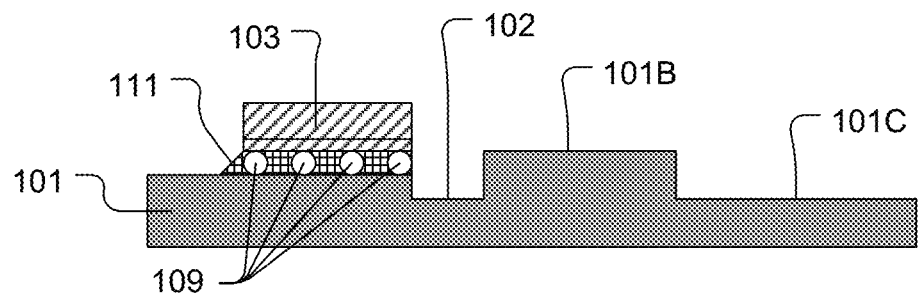
FIG. 2D shows a vertical cross-section view of the underfill epoxy disposed between the laser array chip and the substrate and between the solder balls of the BGA, referenced as View A-A in FIG. 2C-1, in accordance with some embodiments.

FIG. 2D shows a vertical cross-section view of the underfill epoxy 111 disposed between the laser array chip 103 and the substrate 101 and between the solder balls of the BGA 109, referenced as View A-A in FIG. 2C-1, in accordance with some embodiments. During application of the underfill epoxy 111, the trench 102 acts as a reservoir to enable the fabricator to control the flow of the underfill epoxy 111.

Figures 1, 2E:
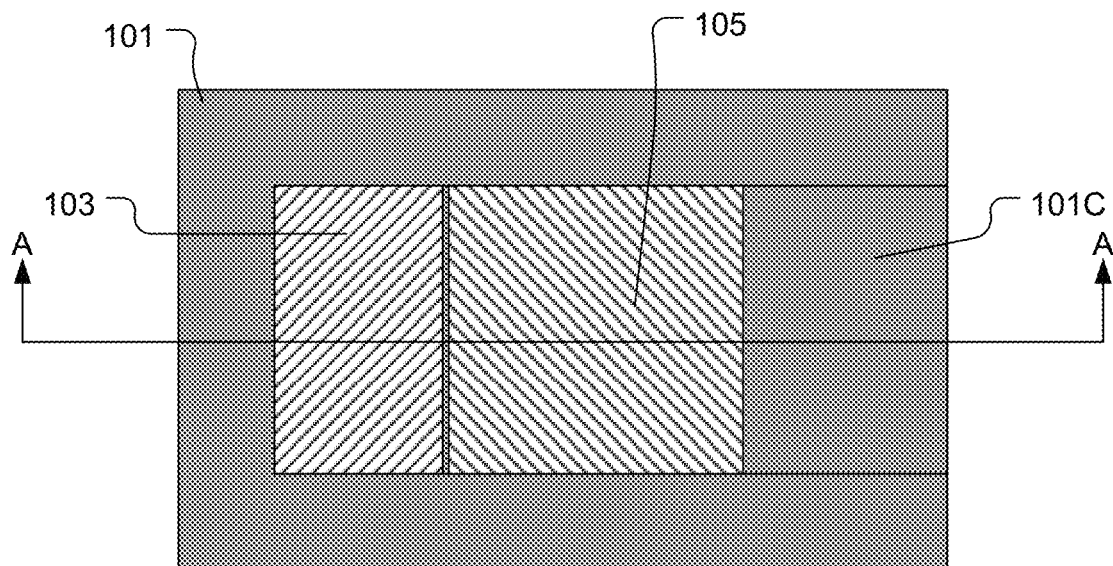
Figures 2, 2E:
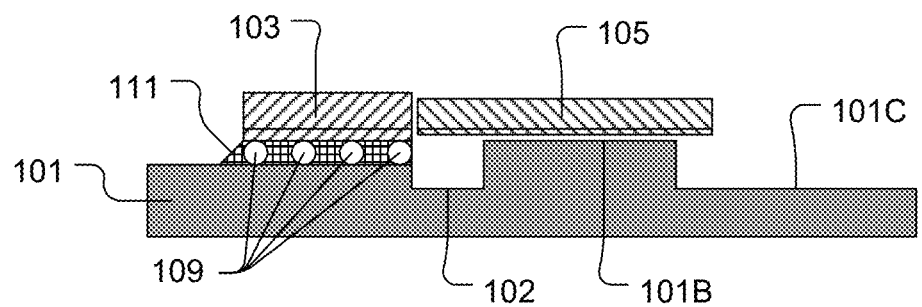

FIG. 2E-1 shows a top view of the PLC 105 disposed on the substrate 101, in accordance with some embodiments. FIG. 2E-2 shows a vertical cross-section view of the PLC 105 disposed on the substrate 101, referenced as View A-A in FIG. 2E-1, in accordance with some embodiments. In some embodiments, the PLC 105 is positioned on the substrate 101 such that a small gap exists between the PLC 105 and the laser array chip 103. This small gap allows for movement of the PLC 105 relative to the laser array chip 103 during the process of actively aligning the PLC 105 to the laser array chip 103. As previously discussed, the alignment lasers DFB-A1 and/or DFB-A2 along with their corresponding photodetectors PD-A1 and PD-A2 are operated to actively align the PLC 105 to the laser array chip 103. Therefore, at this stage of hybrid MWS 100 assembly process, power is supplied to the laser array chip 103. In some embodiments, power is supplied to the laser array chip 103 through circuitry within the substrate 101. Also, it should be appreciated that by using the integrated alignment lasers DFB-A1 and/or DFB-A2 and the integrated photodetectors PD-A1 and/or PD-A2 on the laser array chip 103 in conjunction with the loopback alignment waveguides WG-1 and WG-2 on the PLC 105, it is not necessary for the alignment tool (the tool used to position the PLC 105 on the substrate 101) to have a laser or a photodetector for alignment purposes.

Figure 2F:
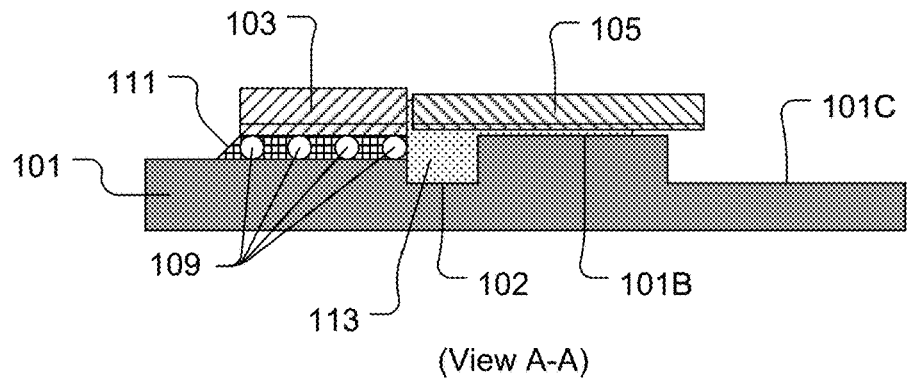
FIG. 2F shows a vertical cross-section view of the optical index-matched epoxy disposed between the PLC and the substrate, referenced as View A-A in FIG. 2E-1, in accordance with some embodiments.

FIG. 2F shows a vertical cross-section view of the optical index-matched epoxy 113 disposed between the PLC 105 and the substrate 101, referenced as View A-A in FIG. 2E-1, in accordance with some embodiments. In some embodiments, the trench 102 facilitates disposal of the optical index-matched epoxy 113 between the PLC 105 and the substrate 101, and between the PLC 105 and the laser array chip 103. Also, it should be appreciated that the mesa-like structure corresponding to the second area 101B of the substrate 101 serves to reduce a thickness of the optical index-matched epoxy 113 bond layer between the PLC 105 and the substrate 101.

Figures 1, 2G:
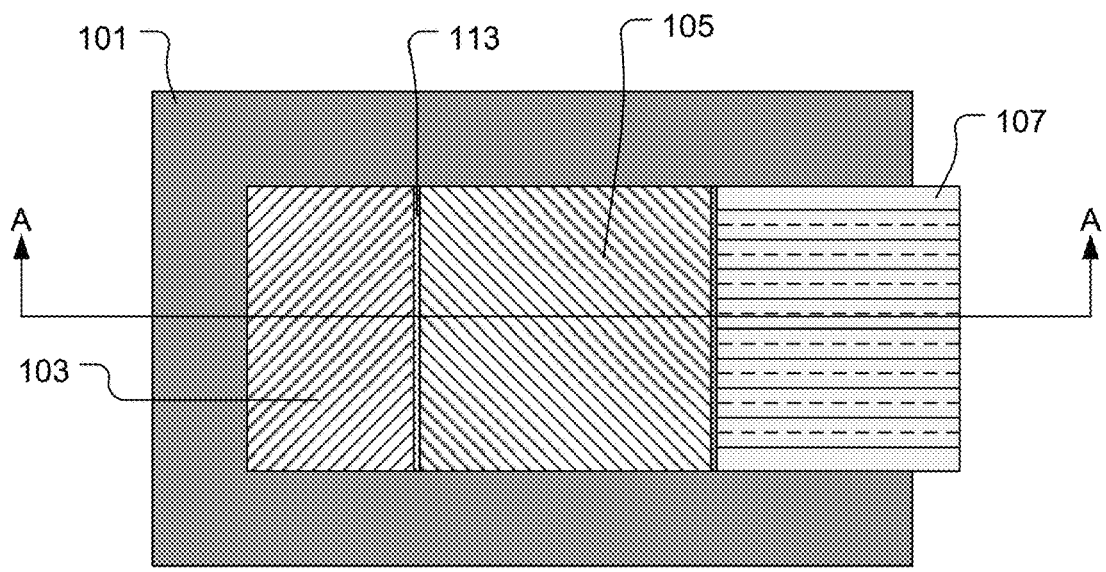
Figures 2, 2G:
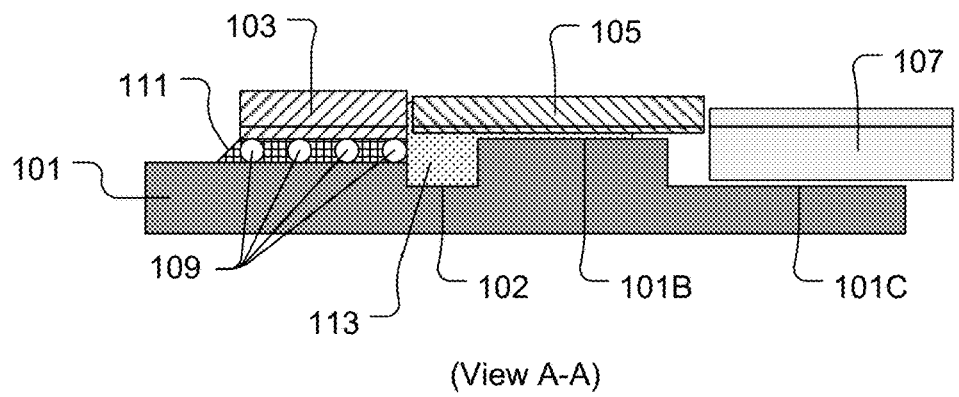
Figure 2H:
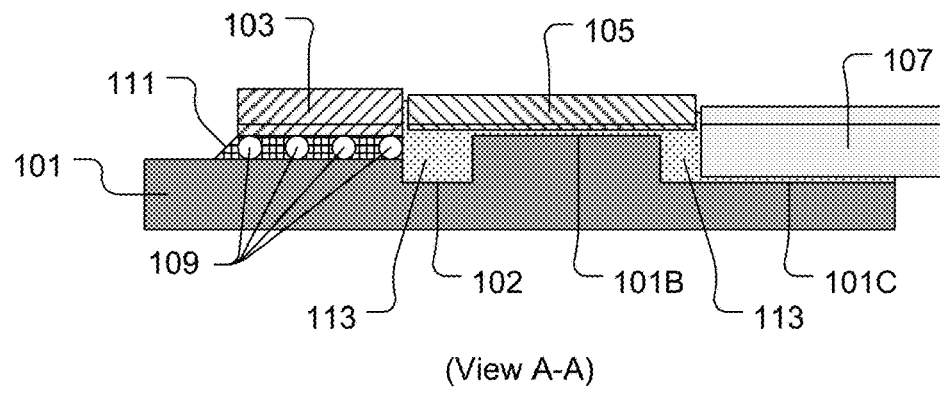
FIG. 2H shows a vertical cross-section view of the optical index-matched epoxy disposed between the optical fiber alignment device and the substrate, referenced as View A-A in FIG. 2G-1, in accordance with some embodiments.

FIG. 2G-1 shows a top view of the optical fiber alignment device 107 disposed on the substrate 101, in accordance with some embodiments. FIG. 2G-2 shows a vertical cross-section view of the optical fiber alignment device 107 disposed on the substrate 101, referenced as View A-A in FIG. 2G-1, in accordance with some embodiments. In some embodiments, the optical fibers 151 are attached to the optical fiber alignment device 107 before the optical fiber alignment device 107 is attached to the substrate 101. In these embodiments, one or more of the lasers DFB-1 to DFB-N of the laser array chip 103 can be operated to provide for a light source for active alignment of the optical fiber alignment device 107 with the PLC 105. In these embodiments, at least some of the optical fibers 151 attached to the optical fiber alignment device 107 are optically connected to a photodetector device to provide for detection of light transmission through the optical fibers 151, which indicates proper optical alignment of the optical fibers 151 with the optical output ports PLC-O1 to PLC-ON of the PLC 105, which in turn indicates proper positioning and alignment of the optical fiber alignment device 107 relative to the substrate 101. FIG. 2H shows a vertical cross-section view of the optical index-matched epoxy 113 disposed between the optical fiber alignment device 107 and the substrate 101, referenced as View A-A in FIG. 2G-1, in accordance with some embodiments.

Figures 1, 2I:
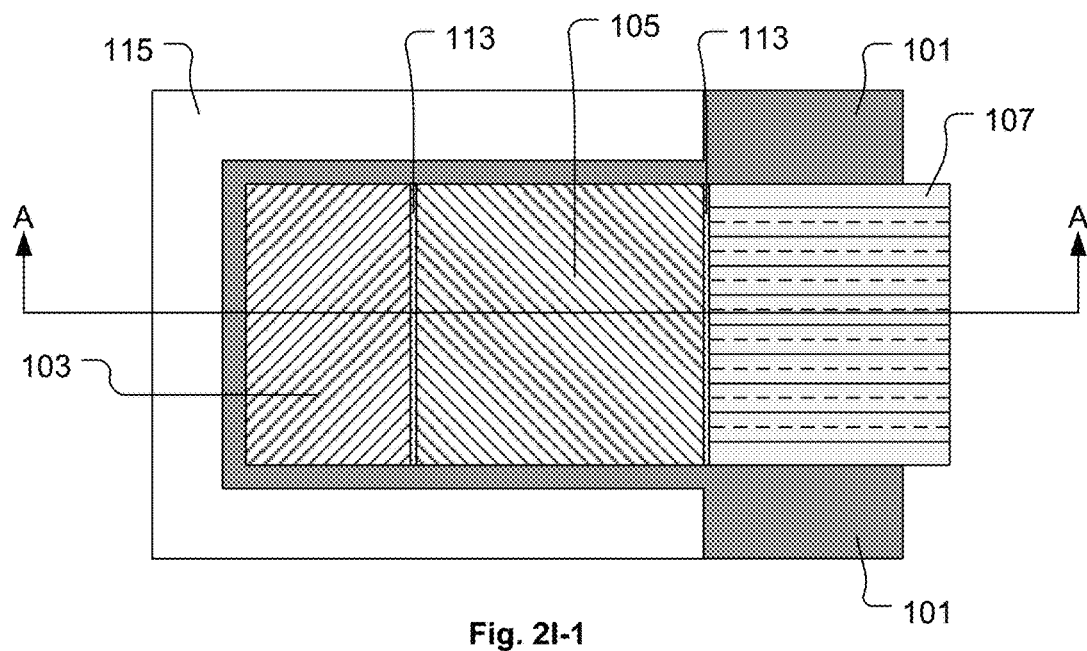
Figures 2, 2I:
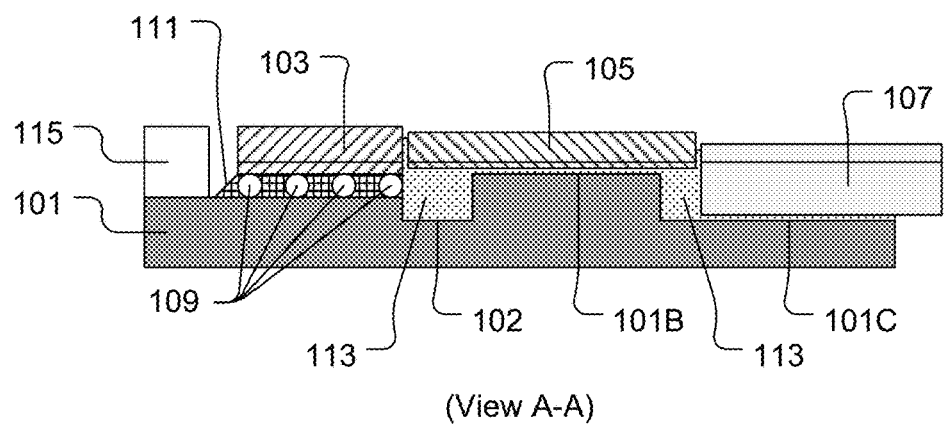

FIG. 2I-1 shows a top view of the stiffener structure 115 disposed on the substrate 101, in accordance with some embodiments. FIG. 2I-2 shows a vertical cross-section view of the stiffener structure 115 disposed on the substrate 101, referenced as View A-A in FIG. 2I-1, in accordance with some embodiments. An elevation of a top surface of the stiffener structure 115 above the substrate 101 is at least as high as an elevation of a top surface of the laser array chip 103 above the substrate 101 and an elevation of a top surface of the PLC 105 above the substrate 101. The stiffener structure 115 is configured to provide rigidity and mechanical strength to the hybrid MWS 100. The stiffener structure 115 is also configured to provide a mounting structure for the lid 119. In some embodiments, the stiffener structure 115 is configured to extend around a union of the first area 101A and the second area 101B of the substrate 101 without encroaching within the third area 101C of the substrate 101.

Figures 1, 2J:
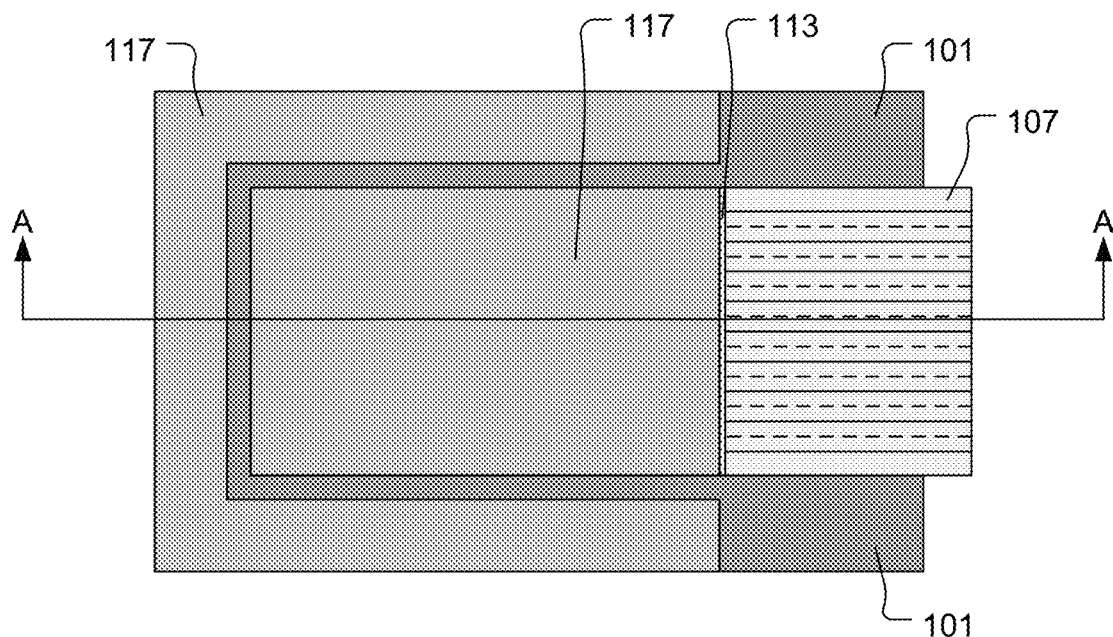
Figures 2, 2J:
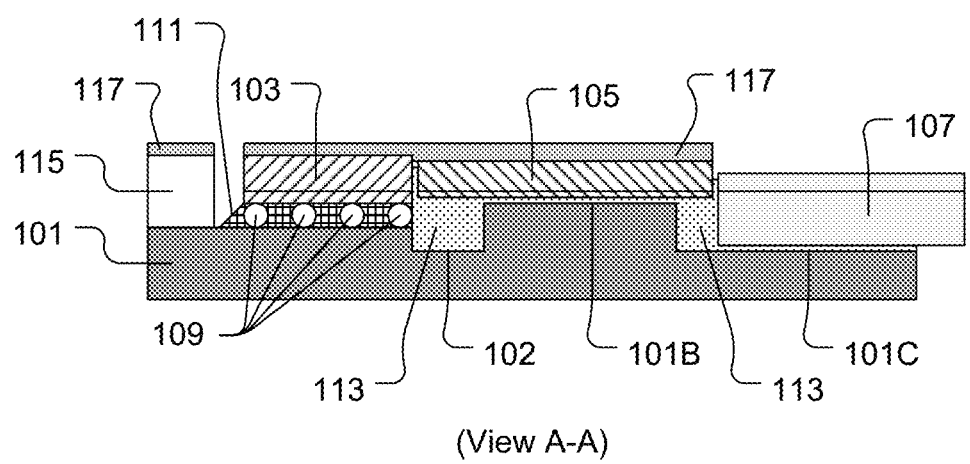

FIG. 2J-1 shows a top view of the TIM 117 disposed on the stiffener structure 115, the laser array chip 103, and the PLC 105, in accordance with some embodiments. FIG. 2J-2 shows a vertical cross-section view of the TIM 117 disposed on the stiffener structure 115, the laser array chip 103, and the PLC 105, referenced as View A-A in FIG. 2J-1, in accordance with some embodiments. FIG. 1A shows a top view of the lid 119 disposed on the TIM 117, in accordance with some embodiments. FIG. 1B shows a vertical cross-section view of the lid 119 disposed on the TIM 117, referenced as View A-A in FIG. 1A, in accordance with some embodiments. In this embodiment, the TIM 117 functions as an adhesive to secure the lid 119 to the stiffener structure 115, the laser array chip 103, and the PLC 105.

Figure 3:
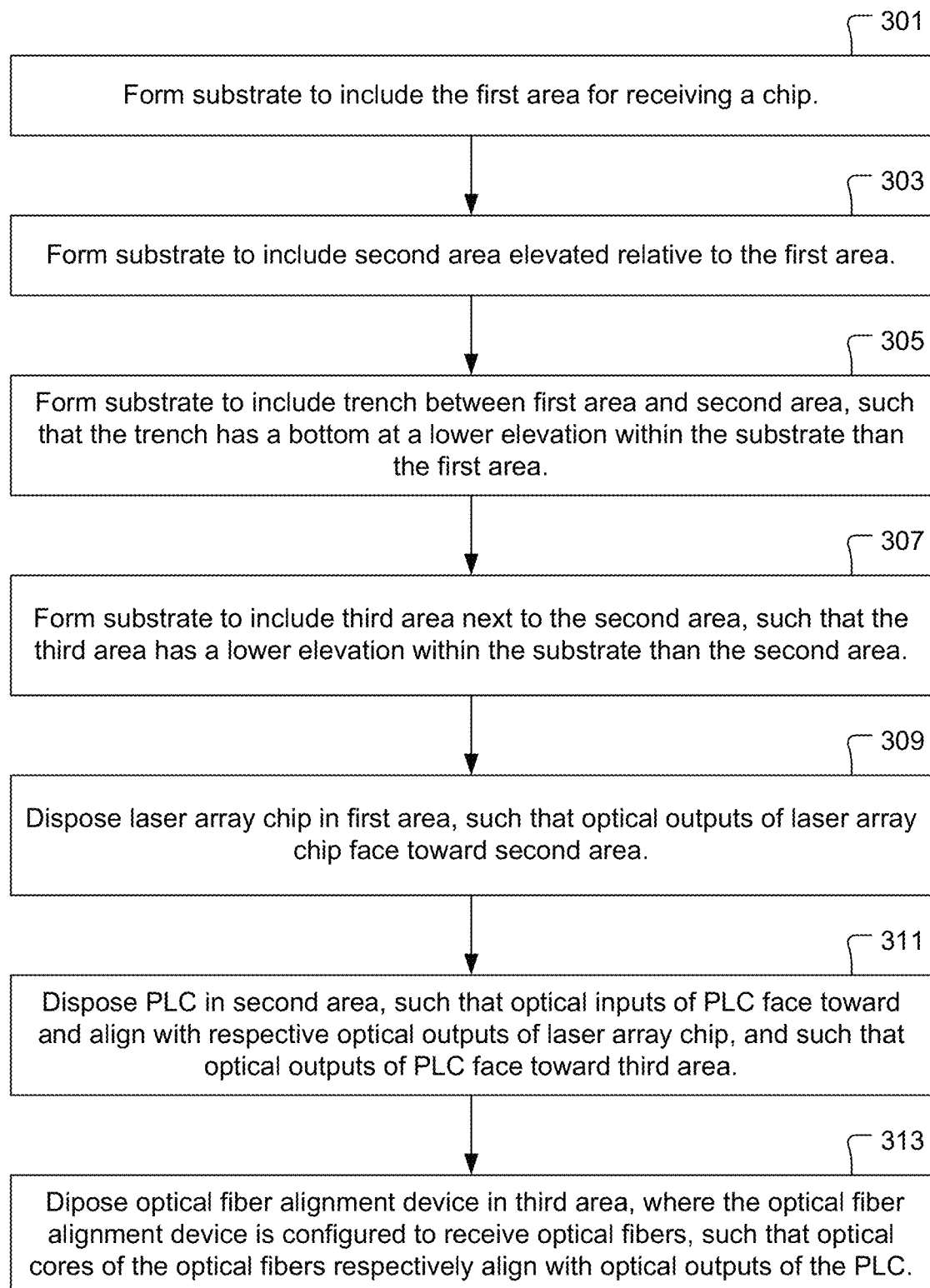
FIG. 3 shows a flowchart of a method for manufacturing the hybrid MWS, in accordance with some embodiments.

FIG. 3 shows a flowchart of a method for manufacturing the hybrid MWS 100, in accordance with some embodiments. The method includes an operation 301 for forming the substrate 101 to include the first area 101A for receiving a chip. In some embodiments, the substrate is formed of a dielectric material. In some embodiments, the substrate is formed of a ceramic material. In some embodiments, the substrate is formed of aluminum oxide, or aluminum nitride, or a similar ceramic material. The method also includes an operation 303 for forming the substrate 101 to include the second area 101B elevated relative to the first area 101A. The method also includes an operation 305 for forming the substrate 101 to include the trench 102 between the first area 101A and the second area 101B. The trench 102 has a bottom at a lower elevation within the substrate 101 than the first area 101A. In some embodiments, the trench 102 is formed to extend along the full length of the side of the laser array chip 103 that faces toward the PLC 105. The method also includes an operation 307 for forming the substrate 101 to include the third area 101C next to the second area 101B. The third area 101C has a lower elevation within the substrate 101 than the second area 101B. The method also includes an operation 309 for disposing the laser array chip 103 in the first area 101A, such that the optical outputs L-O1 to L-ON of the laser array chip 103 face toward the second area 101B. The method also includes an operation 311 for disposing the PLC 105 in the second area 101B, such that the optical inputs PLC-I1 to PLC-IN of the PLC 105 face toward and align with respective optical outputs L-O1 to L-ON of the laser array chip 103, and such that optical outputs PLC-O1 to PLC-OM of the PLC 105 face toward the third area 101C. The method also includes an operation 313 for disposing the optical fiber alignment device 107 in the third area 101C. The optical fiber alignment device 107 is configured to receive the number of optical fibers 151, such that optical cores of the number of optical fibers 151 respectively align with the optical outputs PLC-O1 to PLC-OM of the PLC 105.

The method also includes positioning the PLC 105 so that the optical inputs PLC-I1 to PLC-IN of the PLC 105 respectively receive CW laser light from the optical outputs L-O1 to L-ON of the laser array chip 103, such that each of the optical inputs PLC-I1 to PLC-IN of the PLC 105 receives a different wavelength of CW laser light. In some embodiments, the method includes operating the laser array chip 103 to perform active alignment of the PLC 105 to the laser array chip 103 after the laser array chip 103 is disposed in the first area 101A on the substrate 101 and is connected to the substrate 101.

In some embodiments, the method includes operating the first alignment laser DFB-A1 on the laser array chip 103 to transmit CW laser light through the first alignment optical output L-AO1 on the laser array chip 103. Also, in these embodiments, the method includes operating the first alignment photodetector PD-A1 on the laser array chip 103 to detect when the CW laser light enters the first alignment optical input L-AI1 on the laser array chip 103, by way of having traveled through the first alignment waveguide WG-1 on the PLC 105. Also, in these embodiments, the method includes aligning the PLC 105 on the substrate 101 relative to the laser array chip 103 so that the CW laser light transmitted through the first alignment optical output L-AO1 on the laser array chip 103 enters the first alignment optical input PLC-AI1 on the PLC 105 and travels through the first alignment waveguide WG-1 to exit the first alignment optical output PLC-AO1 on the PLC 105 and enter the first alignment optical input L-AI1 on the laser array chip 103 and be detected by the first alignment photodetector PD-A1.

In some embodiments, the method further includes operating the second alignment laser DFB-A2 on the laser array chip 103 to transmit CW laser light through the second alignment optical output L-AO2 on the laser array chip 103. In these embodiments, the method also includes operating the second alignment photodetector PD-A2 to detect when the CW laser light enters the second alignment optical input L-AI2 on the laser array chip 103. Also, in these embodiments, the method includes aligning the PLC 105 on the substrate 101 relative to the laser array chip 103 so that the CW laser light transmitted through the second alignment optical output L-AO2 on the laser array chip 103 enters the second alignment optical input PLC-AI2 on the PLC 105 and travels through the second alignment waveguide WG-2 to exit the second alignment optical output PLC-AO2 on the PLC 105 and enter the second alignment optical input L-AI2 on the laser array chip 103 and be detected by the second alignment photodetector PD-A2.

Also, in some embodiments, the operation 309 for disposing the laser array chip 103 in the first area 101A of the substrate 101 includes flip-chip connecting of the laser array chip 103 to the substrate 101 using the BGA 109 or other connection mechanism. Also, in these embodiments, the method includes disposing the BGA 109 on the plurality of electrically conductive pads exposed at the surface of the substrate 101. Also, in some embodiments, the method includes disposing the epoxy underfill material 111 within the first area 101A on the substrate 101 between the laser array chip 103 and the substrate 101, and between solder balls of the BGA 109. In some embodiments, the method includes using the trench 102 to facilitate deposition of the epoxy underfill material 111.

Also, in some embodiments, the method includes disposing the index-matched epoxy material 113 between the PLC 105 and the substrate 101. Also, in some embodiments, the method includes disposing the index-matched epoxy material 113 to fill the trench 102 in the substrate 101 and the gap between the laser array chip 103 and the PLC 105. Also, in some embodiments, the method includes disposing the index-matched epoxy material 113 between the optical fiber alignment device 107 and the substrate 101. Also, in some embodiments, the method includes disposing the index-matched epoxy material 113 to fill the gap between the PLC 105 and the optical fiber alignment device 107.

Also, in some embodiments, the method includes attaching the stiffener structure 115 to the substrate 101, such that the stiffener structure extends around a union of the first area 101A and the second area 101B on the substrate 101 without encroaching within the third area 101C on the substrate 101. Also, in some embodiments, the method includes disposing the TIM 117 across top surfaces of the stiffener structure 115, the laser array chip 103, and the PLC 105. Also, in some embodiments, the method includes positioning the lid structure 119 on the TIM 117, such that the lid structure 119 covers the laser array chip 103 and the PLC 105, and such that the lid structure 119 also extends over the stiffener structure 115.

Figure 4:
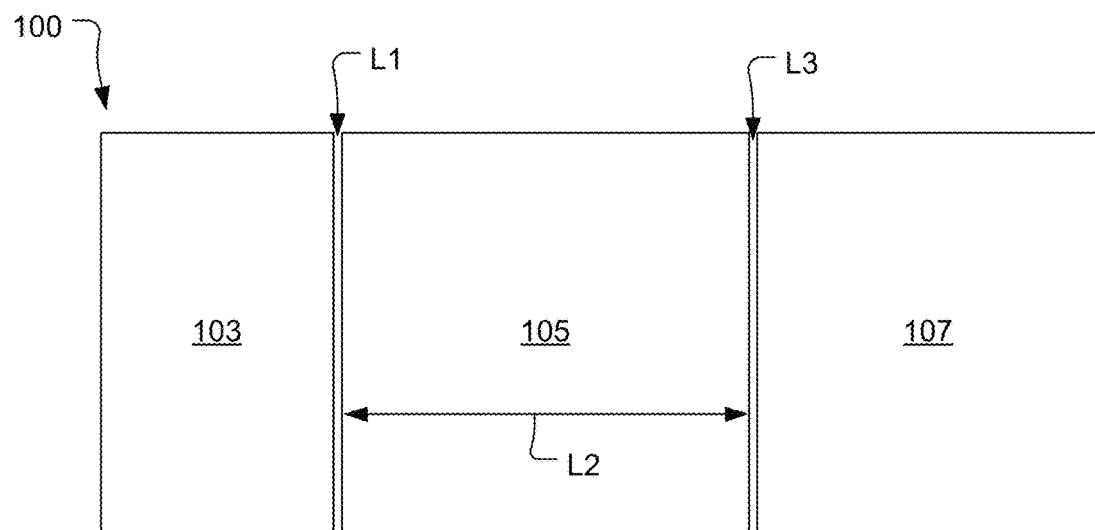
FIG. 4 shows a diagram of the hybrid MWS indicating where optical losses occur, in accordance with some embodiments.

FIG. 4 shows a diagram of the hybrid MWS 100 indicating where optical losses occur, in accordance with some embodiments. For each wavelength of light generated by a corresponding one of the plurality of lasers DFB-1 to DFB-N in the laser array chip 103, a first optical loss L1 occurs at the interface between the laser array chip 103 and the PLC 105. In some embodiments, the first optical loss L1 is less than or equal to about 2 dB. For each wavelength of light, a second optical loss L2 occurs as the light travels through the PLC 105 to the plurality (M) of optical outputs PLC-O1 to PLC-OM of the PLC 105. In some embodiments, the second optical loss L2 is less than or equal to about 1.7 dB. Also, for each wavelength of light, a third optical loss L3 occurs at the interface between the PLC 105 of the optical fiber 151-x. In some embodiments, the third optical loss L3 is less than or equal to about 1 dB.

Figure 5:
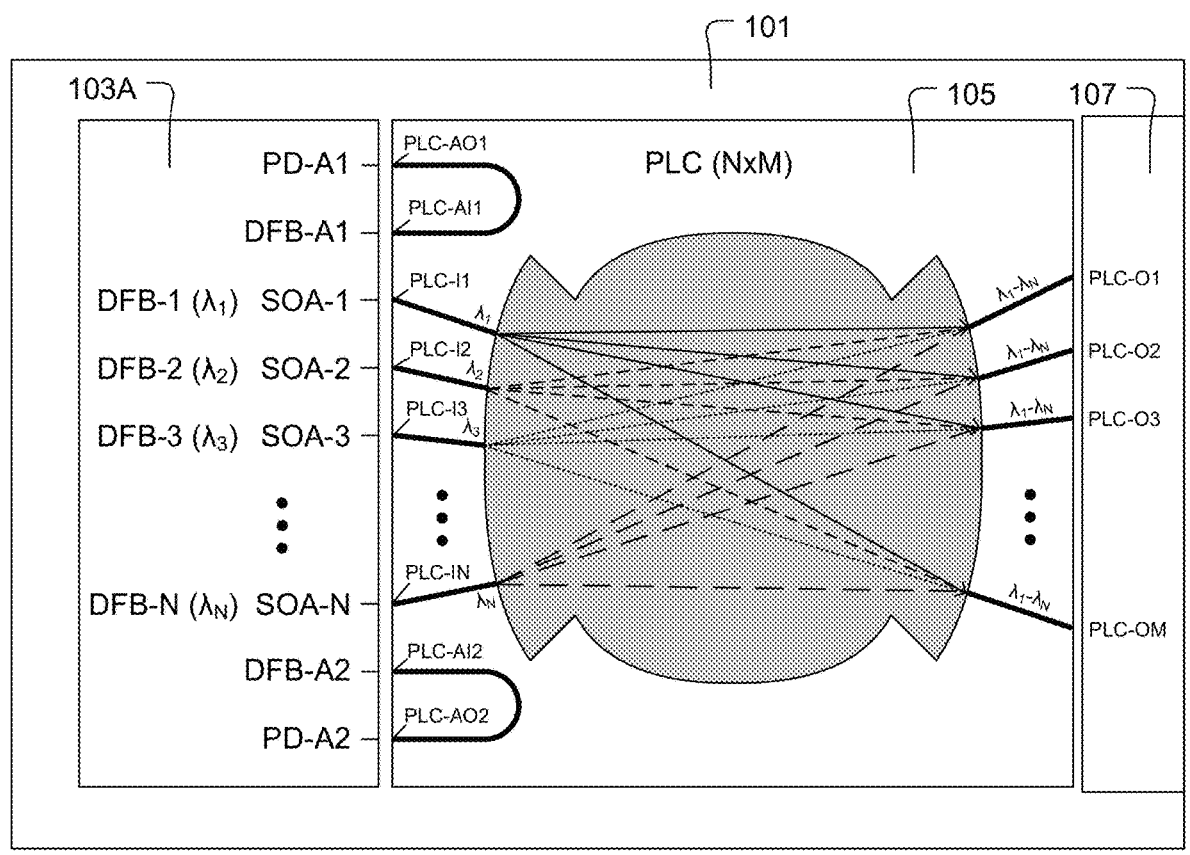
FIG. 5 shows a modified laser array chip coupled to the PLC, in accordance with some embodiments.

FIG. 5 shows a modified laser array chip 103A coupled to the PLC 105, in accordance with some embodiments. The modified laser array chip 103A includes semiconductor optical amplifiers SOA-1 to SOA-N respectively disposed to amplify the CW laser light generated by the lasers DFB-1 to DFB-N. Each of SOA-1 to SOA-N is configured to generate an amplified version of the CW laser light received from the respective one of the lasers DFB-1 to DFB-N and provide the amplified version of the CW laser light to the respective optical output L-O1 to L-ON of the laser array chip 103. In various embodiments, the modified laser array chip 103A can be implemented in the hybrid MWS 100 in place of the laser array chip 103.

Figure 6:
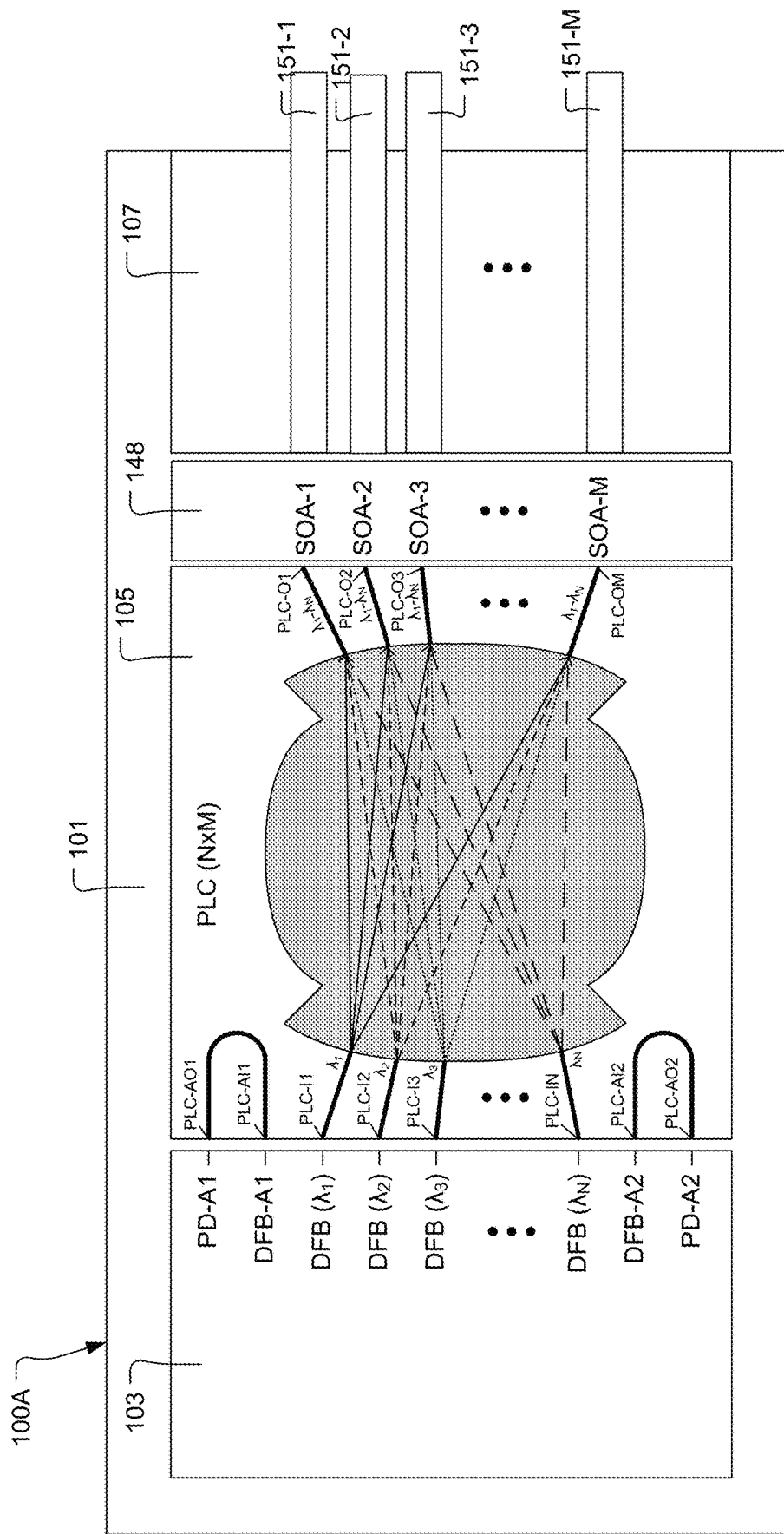
FIG. 6 shows a modified hybrid MWS, in accordance with some embodiments.

FIG. 6 shows a modified hybrid MWS 100A, in accordance with some embodiments. The modified hybrid MWS 100A is like the hybrid MWS 100, with the exception that an array of SOAs 148 is disposed between the PLC 105 and the optical fibers 151-1 to 151-M, which are attached to the optical fiber alignment device 107. The array of SOAs 148 includes SOA-1 to SOA-M respectively positioned to receive light from the optical outputs PLC-O1 to PLC-OM of the PLC 105. Each of SOA-1 to SOA-M is configured to amplify the received light and transmit the amplified light into the optical core of the respective one of the optical fibers 151-1 to 151-M. The array of SOAs 148 is positioned on the substrate 101 and secured to the substrate 101 by the optical index-matched epoxy 113. As compared to the SOA implementation in the modified laser array chip 103A of FIG. 5, the array of SOAs 148 provides for separate optimization of the lasers DFB-1 to DFB-N and the SOA-1 to SOA-N. Also, as compared to the SOA implementation in the modified laser array chip 103A of FIG. 5, the array of SOAs 148 provides more gain from each of SOA-1 to SOA-N and lower optical insertion loss through the PLC 105.

Figure 7:
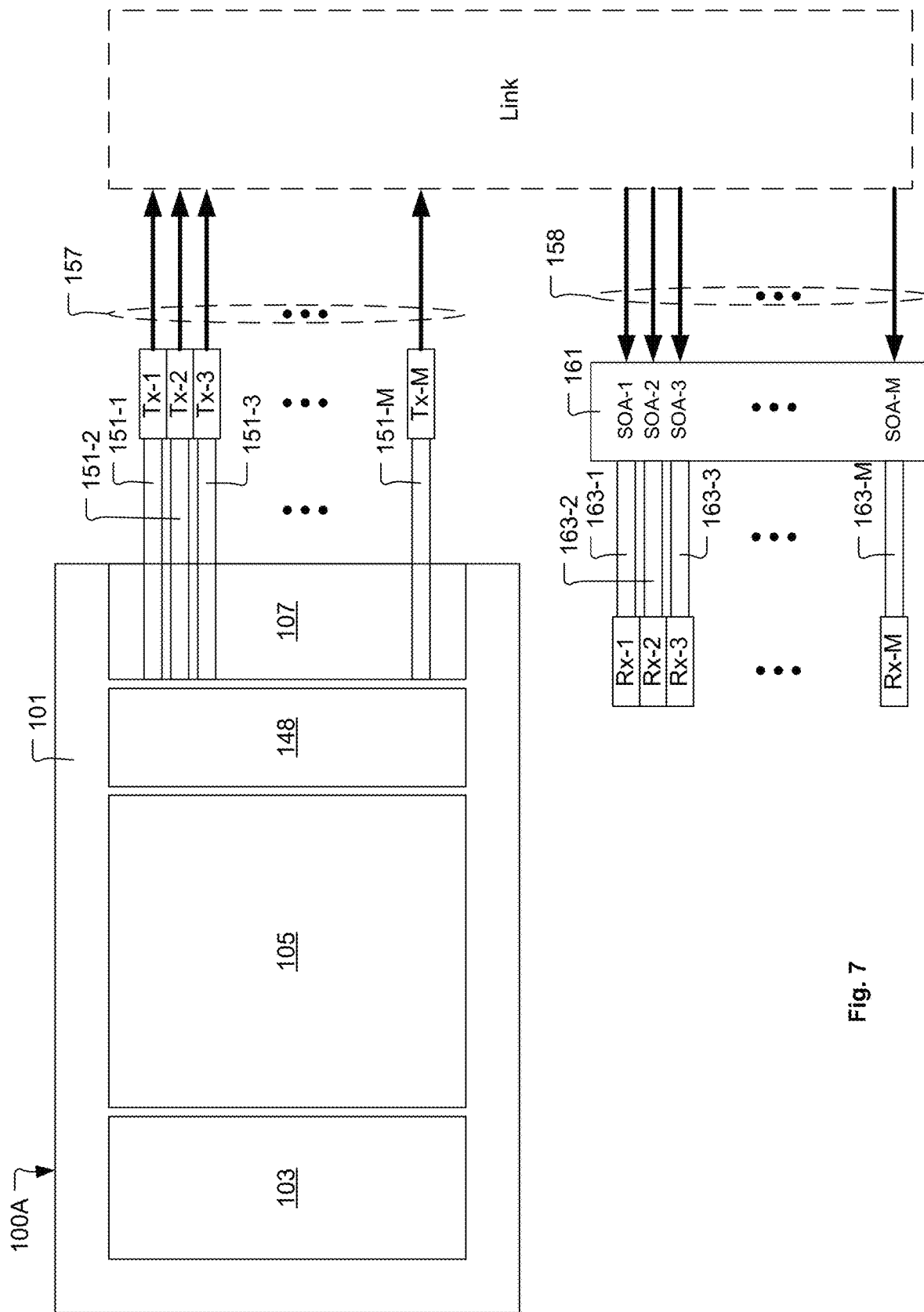
FIG. 7 shows the modified hybrid MWS implemented within a pre-amplified receiver, in accordance with some embodiments.

FIG. 7 shows the modified hybrid MWS 100A implemented within a pre-amplified receiver, in accordance with some embodiments. The optical fibers 151-1 to 151-M are optically connected to respective optical transmitters Tx-1 to Tx-M. Each of the optical transmitters Tx-1 to Tx-M is optically connected to an optical data communication link, as indicated by arrows 157. An array of SOAs 161 is optically connected to receive the optical signals from the optical transmitters Tx-1 to Tx-M, by way of the optical data communication link, as indicated by arrows 158. Each of SOA-1 to SOA-M amplifies the optical signal that it receives and transmits the amplified optical signal to through a respective optical fiber 163-1 to 163-M to a respective optical receiver Rx-1 to Rx-M. Use of the modified hybrid MWS 100A in the pre-amplified receiver of FIG. 7 provides extra gain from the unsaturated array of SOAs 148 and can improve link margin to +3 dB or better.

Figure 8:
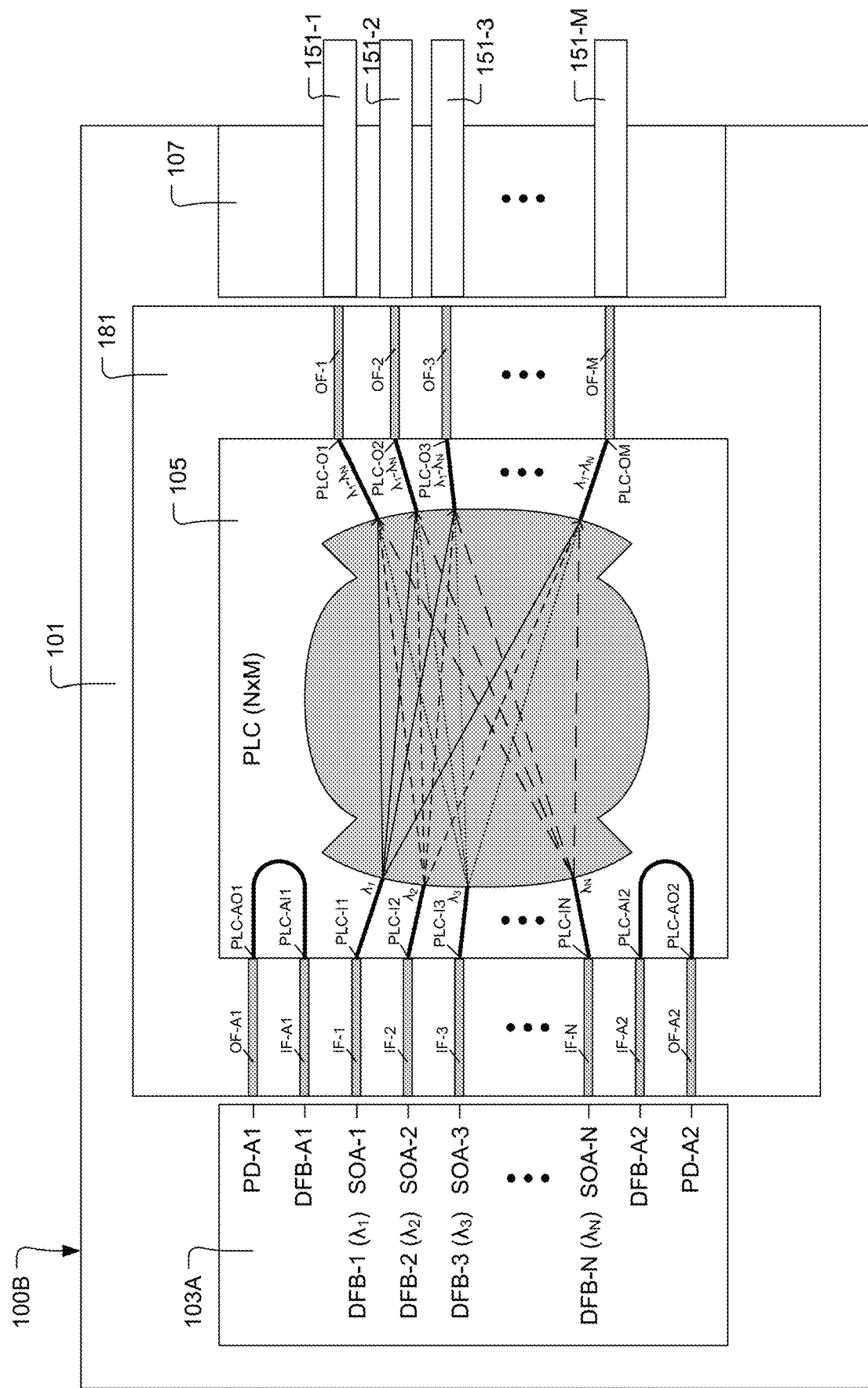
FIG. 8 shows a modified hybrid MWS that includes the modified laser array chip of FIG. 5 and optical fiber interfaces for the optical inputs and optical outputs of the PLC, in accordance with some embodiments.

FIG. 8 shows a modified hybrid MWS 100B that includes the modified laser array chip 103A of FIG. 5 and optical fiber interfaces for the optical inputs and optical outputs of the PLC 105, in accordance with some embodiments. The PLC 105 is disposed on a substrate 181. The substrate 181 is disposed on the substrate 101. Respective optical fibers IF-1 to IF-N are secured to the substrate 181 and are respectively optically connected to the optical inputs PLC-I1 to PLC-IN of the PLC 105. Also, respective optical fibers OF-1 to OF-M are secured to the substrate 181 and are respectively optically connected to the optical outputs PLC-O1 to PLC-OM of the PLC 105. Also, in some embodiments, optical fibers IF-A1 and OF-A1 are optically connected to the first alignment optical input PLC-AI1 and the first alignment optical output PLC-AO1 of the PLC 105, respectively. The optical fibers IF-A1 and OF-A1 are secured to the substrate 181. Also, in some embodiments, optical fibers IF-A2 and OF-A2 are optically connected to the second alignment optical input PLC-AI2 and the second alignment optical output PLC-AO2 of the PLC 105, respectively. The optical fibers IF-A2 and OF-A2 are secured to the substrate 181. Use of optical fiber interfaces for the optical inputs and optical outputs of the PLC 105 serve to reduce the optical losses through the PLC 105. Also, use of optical fiber interfaces for the optical inputs and optical outputs of the PLC 105 makes it easer to implement optical isolators, if needed.

Figure 9:
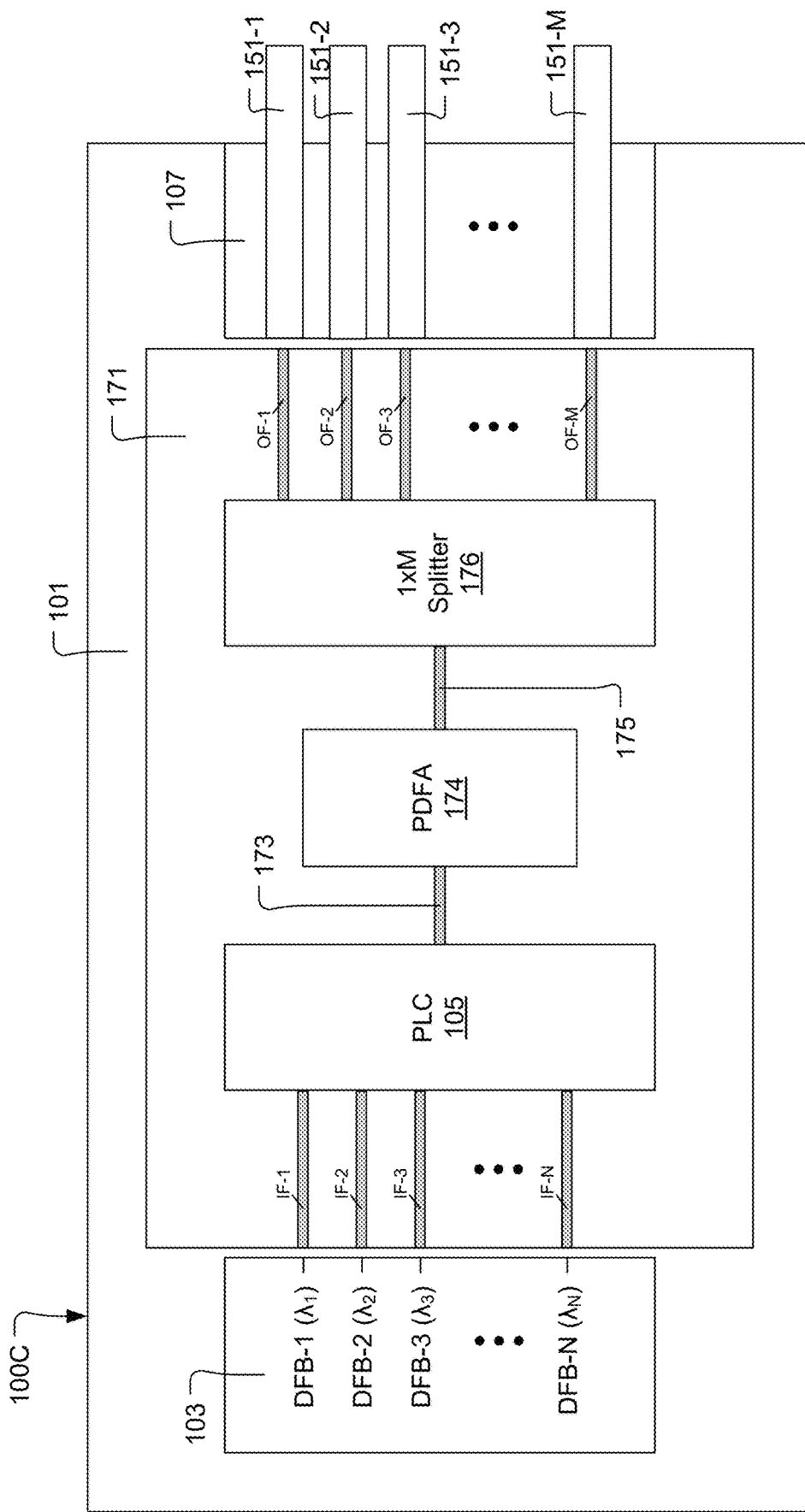
FIG. 9 shows a modified hybrid MWS that includes implementation of the PLC in conjunction with a praseodymium-doped fiber amplifier (PDFA) and a 1×M optical splitter, in accordance with some embodiments.

FIG. 9 shows a modified hybrid MWS 100C that includes implementation of the PLC 105 in conjunction with a praseodymium-doped fiber amplifier (PDFA) 174 and a 1×M optical splitter 176, in accordance with some embodiments. The PLC 105 is implemented on a substrate 171. The substrate 171 is attached to the substrate 101. Optical fibers IF-1 to IF-N are optically connected to the optical inputs PLC-I1 to PLC-IN of the PLC 105. The optical fibers IF-1 to IF-N are attached to the substrate 171. Each optical fiber IF-1 to IF-N receives CW laser light from a respective one of the lasers DFB-1 to DFB-N in the laser array chip 103. The PLC 105 is implemented with the number (M) of optical outputs equal to one. A first end of an optical fiber 173 is optically connected to the optical output PLC-O1 of the PLC 105. A second end of the optical fiber 173 is optically connected to an optical input of the PDFA 174. The optical fiber 173 is attached to the substrate 171. A first end of an optical fiber 175 is optically connected to an optical output of the PDFA 174. A second end of the optical fiber 175 is optically connected to an optical input of the 1×M optical splitter 176. The optical fiber 175 is attached to the substrate 171. The number (M) of optical fibers OF-1 to OF-M are respectively optically connected to the (M) optical outputs of the 1×M optical splitter 176. The optical fibers OF-1 to OF-M are attached to the substrate 171. The optical cores of the optical fibers 151-1 to 151-M are aligned to optically couple with the optical cores of the optical fibers OF-1 to OF-M, respectively.

The foregoing description of the embodiments has been provided for purposes of illustration and description. It is not intended to be exhaustive or to limit the invention. Individual elements or features of a particular embodiment are generally not limited to that particular embodiment, but, where applicable, are interchangeable and can be used in other embodiment(s), even if not specifically shown or described. The same may also be varied in many ways. Such variations are not to be regarded as a departure from the invention, and all such modifications are intended to be included within the scope of the invention.

Although the foregoing invention has been described in some detail for purposes of clarity of understanding, it will be apparent that certain changes and modifications can be practiced within the scope of the appended claims. Accordingly, the present embodiments are to be considered as illustrative and not restrictive, and the invention is not to be limited to the details given herein, but may be modified within the scope and equivalents of the described embodiments.

What is claimed is:

1. A method for manufacturing a multi-wavelength source, comprising:
    forming a substrate to include a first area for receiving a chip;
    forming the substrate to include a second area elevated relative to the first area;
    forming the substrate to include a trench between the first area and the second area, the trench having a bottom at a lower elevation within the substrate than the first area;
    forming the substrate including a third area next to the second area, the third area having a lower elevation within the substrate than the second area;
    disposing a laser array chip in the first area, such that optical outputs of the laser array chip face toward the second area;
    disposing a planar lightwave circuit in the second area, such that optical inputs of the planar lightwave circuit face toward and align with respective optical outputs of the laser array chip, and such that optical outputs of the planar lightwave circuit face toward the third area; and
    disposing an optical fiber alignment device in the third area, the optical fiber alignment device configured to receive a number of optical fibers such that optical cores of the number of optical fibers respectively align with the optical outputs of the planar lightwave circuit;
    wherein the trench is formed to extend along a full length of a side of the laser array chip that faces toward the planar lightwave circuit.

2. The method as recited in claim 1, wherein the substrate is formed of a dielectric material.

3. The method as recited in claim 1, wherein the substrate is formed of aluminum oxide, or aluminum nitride, or a ceramic material.

4. The method as recited in claim 1, wherein the laser array chip includes a number (N) of distributed feedback lasers, wherein N is greater than one, each of the number (N) of distributed feedback lasers configured to generate a different wavelength of continuous wave laser light, each of the number (N) of distributed feedback lasers optically connected to transmit the different wavelength of continuous wave laser light to a respective optical output of the laser array chip, such that each optical output of the laser array chip outputs one unique wavelength of continuous wave laser light.

5. The method as recited in claim 4, wherein the laser array chip includes the number (N) of semiconductor optical amplifiers respectively optically connected to the number (N) of distributed feedback lasers, each of the number (N) of semiconductor optical amplifiers configured to generate an amplified version of the continuous wave laser light received from the respective one of the number (N) of distributed feedback lasers and provide the amplified version of the continuous wave laser light to the respective optical output of the laser array chip.

6. The method as recited in claim 4, wherein the planar lightwave circuit has the number (N) of optical inputs, wherein the method includes positioning the planar lightwave circuit so that the number (N) of optical inputs of the planar lightwave circuit respectively receive continuous wave laser light from the number (N) of optical outputs of the laser array chip, such that each of the number (N) of optical inputs of the planar lightwave circuit receives a different wavelength of continuous wave laser light,
    wherein the planar lightwave circuit has a number (M) of optical outputs, the planar lightwave circuit configured to distribute a portion of the continuous wave laser light received at each of the optical inputs of the planar lightwave circuit to each of the number (M) of optical outputs of the planar lightwave circuit, such that the different wavelengths of continuous wave laser light received through the number (N) of optical inputs of the planar lightwave circuit are collectively transmitted through each of the number (M) of optical outputs of the planar lightwave circuit.

7. The method as recited in claim 6, wherein the optical fiber alignment device is configured to receive the number (M) of optical fibers.

8. The method as recited in claim 7, wherein the optical fiber alignment device is a v-groove array that includes the number (M) of v-grooves.

9. The method as recited in claim 6, wherein the laser array chip includes a first alignment laser configured and connected to provide continuous wave laser light to a first alignment optical output on the laser array chip, the first alignment optical output on the laser array chip positioned at a first side of the number (N) of distributed feedback lasers, the method including positioning of the laser array chip on the substrate so that the first alignment optical output on the laser array chip faces toward the second area,
    wherein the laser array chip includes a first alignment photodetector optically connected to a first alignment optical input on the laser array chip, the first alignment optical input on the laser array chip positioned next to the first alignment optical output on the laser array chip, the method including positioning of the laser array chip on the substrate so that the first alignment optical input on the laser array chip faces toward the second area,
    wherein the planar lightwave circuit includes a first alignment waveguide configured to extend from a first alignment optical input on the planar lightwave circuit to a first alignment optical output on the planar lightwave circuit, such that light entering the first alignment optical input on the planar lightwave circuit is conveyed through the first alignment waveguide and through the first alignment optical output on the planar lightwave circuit, the method including positioning of the planar lightwave circuit on the substrate so that both the first alignment optical input on the planar lightwave circuit and the first alignment optical output on the planar lightwave circuit face toward the first area, wherein the method includes operating the first alignment laser to transmit continuous wave laser light through the first alignment optical output on the laser array chip, wherein the method includes operating the first alignment photodetector to detect when the continuous wave laser light enters the first alignment optical input on the laser array chip, and wherein the method includes aligning the planar lightwave circuit on the substrate relative to the laser array chip so that the continuous wave laser light transmitted through the first alignment optical output on the laser array chip enters the first alignment optical input on the planar lightwave circuit and travels through the first alignment waveguide to exit the first alignment optical output on the planar lightwave circuit and enter the first alignment optical input on the laser array chip and be detected by the first alignment photodetector.

10. The method as recited in claim 9, wherein the laser array chip includes a second alignment laser configured and connected to provide continuous wave laser light to a second alignment optical output on the laser array chip, the second alignment optical output on the laser array chip positioned at a second side of the number (N) of distributed feedback lasers, the method including positioning of the laser array chip on the substrate so that the second alignment optical output on the laser array chip faces toward the second area, wherein the laser array chip includes a second alignment photodetector optically connected to a second alignment optical input on the laser array chip, the second alignment optical input on the laser array chip positioned next to the second alignment optical output on the laser array chip, the method including positioning of the laser array chip on the substrate so that the second alignment optical input on the laser array chip faces toward the second area, wherein the planar lightwave circuit includes a second alignment waveguide configured to extend from a second alignment optical input on the planar lightwave circuit to a second alignment optical output on the planar lightwave circuit, such that light entering the second alignment optical input on the planar lightwave circuit is conveyed through the second alignment waveguide and through the second alignment optical output on the planar lightwave circuit, the method including positioning of the planar lightwave circuit on the substrate so that both the second alignment optical input on the planar lightwave circuit and the second alignment optical output on the planar lightwave circuit face toward the first area, wherein the method includes operating the second alignment laser to transmit continuous wave laser light through the second alignment optical output on the laser array chip, wherein the method includes operating the second alignment photodetector to detect when the continuous wave laser light enters the second alignment optical input on the laser array chip, and wherein the method includes aligning the planar lightwave circuit on the substrate relative to the laser array chip so that the continuous wave laser light transmitted through the second alignment optical output on the laser array chip enters the second alignment optical input on the planar lightwave circuit and travels through the second alignment waveguide to exit the second alignment optical output on the planar lightwave circuit and enter the second alignment optical input on the laser array chip and be detected by the second alignment photodetector.

11. The method as recited in claim 1, wherein disposing the laser array chip in the first area includes flip-chip connecting of the laser array chip to the substrate using a ball grid array or controlled collapse chip connection bumps.

12. The method as recited in claim 11, wherein the substrate includes a plurality of electrically conductive structures electrically connected to a plurality of electrically conductive pads exposed within the first area, wherein the method includes disposing the ball grid array on the plurality of electrically conductive pads.

13. The method as recited in claim 12, further comprising:
disposing an epoxy underfill material within the first area between the laser array chip and the substrate and between solder balls of the ball grid array; and
using the trench to facilitate deposition of the epoxy underfill material.

14. The method as recited in claim 13, further comprising:
disposing an index-matched epoxy material between the planar lightwave circuit and the substrate;
disposing the index-matched epoxy material to fill the trench and a gap between the laser array chip and the planar lightwave circuit;
disposing the index-matched epoxy material between the optical fiber alignment device and the substrate; and
disposing the index-matched epoxy material to fill a gap between the planar lightwave circuit and the optical fiber alignment device.

15. The method as recited in claim 14, further comprising:
attaching a stiffener structure to the substrate, the stiffener structure configured to extend around a union of the first area and the second area without encroaching within the third area, the stiffener structure having a top surface at a substantially same elevation above the substrate as a top surface of the laser array chip;
disposing a thermal interface material across top surfaces of the stiffener structure, the laser array chip, and the planar lightwave circuit; and
positioning a lid structure on the thermal interface material, the lid structure configured to cover the laser array chip and the planar lightwave circuit, the lid structure also configured to extend over the stiffener structure.

16. The method as recited in claim 1, wherein the laser array chip and the planar lightwave circuit are collectively configured to provide for active alignment of the planar lightwave circuit to the laser array chip through operation of the laser array chip, wherein the method includes operating the laser array chip to perform active alignment of the planar lightwave circuit to the laser array chip after the laser array chip is disposed in the first area and connected to the substrate.

17. The method as recited in claim 1, further comprising:
disposing an epoxy material within the trench.

18. The method as recited in claim 17, wherein the epoxy material has an optical index of refraction that is substantially the same as an optical index of refraction of optical waveguides within the laser array chip and the planar lightwave circuit.

19. The method as recited in claim 18, wherein the epoxy material is disposed to fill the trench.

20. The method as recited in claim 1, further comprising:
electrically connecting the laser array chip to electrically conductive structures within the substrate.

21. The method as recited in claim 1, further comprising:
disposing a stiffener structure on the substrate to extend around a portion of the first area and a portion of the second area.

22. The method as recited in claim 21, wherein the stiffener structure is disposed such that a top surface of the stiffener structure is at a substantially same elevation above the substrate as a top surface of the laser array chip.

23. The method as recited in claim 21, wherein the stiffener structure is substantially U-shaped.

24. The method as recited in claim 1, wherein the first area, the second area, and the third area are respective parts of a top surface of the substrate, and wherein the substrate is formed to have a substantially flat bottom surface.

* * * * *